US012757620B2

(12) United States Patent
Li et al.

(10) Patent No.: US 12,757,620 B2
(45) Date of Patent: Oct. 6, 2026

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Shuo Li, Beijing (CN); Ling Shi, Beijing (CN); Hui Lu, Beijing (CN); Dan Guo, Beijing (CN); Yao Hu, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 864 days.

(21) Appl. No.: 17/797,227

(22) PCT Filed: Nov. 4, 2021

(86) PCT No.: PCT/CN2021/128697
§ 371 (c)(1),
(2) Date: Aug. 3, 2022

(87) PCT Pub. No.: WO2022/160839
PCT Pub. Date: Aug. 4, 2022

(65) Prior Publication Data

US 2023/0345783 A1 Oct. 26, 2023

(30) Foreign Application Priority Data

Jan. 26, 2021 (WO) ................ PCT/CN2021/073725
Jun. 29, 2021 (CN) ......................... 202110726478.2

(51) Int. Cl.
*H10K 59/80* (2023.01)
*G06F 3/041* (2006.01)
(Continued)

(52) U.S. Cl.
CPC ....... *H10K 59/8792* (2023.02); *G06F 3/0412* (2013.01); *G06V 10/141* (2022.01);
(Continued)

(58) Field of Classification Search
CPC ........... H10K 59/8792; H10K 59/1315; H10K 59/40; H10K 59/131; H10K 59/65;
(Continued)

(56) References Cited

U.S. PATENT DOCUMENTS 8,502,445 B2 8/2013 Levermore et al.
11,302,899 B2 4/2022 Ouyang et al.
(Continued)

FOREIGN PATENT DOCUMENTS

CN 102280074 A 12/2011
CN 102722030 A 10/2012
(Continued)

OTHER PUBLICATIONS

U.S. Office Action in U.S. Appl. No. 17/789,674 dated Jul. 30, 2024.
(Continued)

*Primary Examiner* — Michelle Mandala
(74) *Attorney, Agent, or Firm* — Collard & Roe, P.C.

(57) ABSTRACT

A display substrate and a display device are disclosed, the display substrate has a plurality of sub-pixels, and includes a base substrate, a driving circuit layer, a light-emitting device layer, and a black matrix layer, the driving circuit layer includes a first signal line and a second signal line arranged parallel to each other and arranged periodically, the black matrix layer includes a plurality of first light-transmitting openings and a plurality of second light-transmitting openings, the plurality of second light-transmitting openings are respectively arranged between the plurality of first light-transmitting openings, and orthographic projections of the plurality of second light-transmitting openings on the
(Continued)

base substrate are respectively between an orthographic projection of one first signal line on the base substrate and an orthographic projection of one second signal line closest to the one first signal line on the base substrate.

18 Claims, 18 Drawing Sheets

(51) Int. Cl.

| | |
|---|---|
| ***G06V 10/141*** | (2022.01) |
| ***G06V 10/143*** | (2022.01) |
| ***G06V 40/13*** | (2022.01) |
| ***H10K 59/131*** | (2023.01) |
| ***H10K 59/40*** | (2023.01) |
| *G06F 3/042* | (2006.01) |
| *G09G 3/3225* | (2016.01) |
| *H10K 59/65* | (2023.01) |

(52) U.S. Cl.
CPC ........ *G06V 10/143* (2022.01); *G06V 40/1318* (2022.01); *H10K 59/1315* (2023.02); *H10K 59/40* (2023.02); *G06F 3/0421* (2013.01); *G09G 3/3225* (2013.01); *G09G 2300/0426* (2013.01); *G09G 2300/0452* (2013.01); *G09G 2300/0842* (2013.01); *G09G 2354/00* (2013.01); *H10K 59/131* (2023.02); *H10K 59/65* (2023.02)

(58) Field of Classification Search
CPC ............. H10K 59/121; H10K 59/1213; H10K 59/1216; H10K 59/122; H10K 59/123; H10K 59/124; H10K 59/35; H10K 59/38; H10K 59/8051; H10K 59/8052; G06F 3/0412; G06F 3/0421; G06V 10/141; G06V 10/143; G06V 40/1318; G09G 3/3225; G09G 2300/0426; G09G 2300/0452; G09G 2300/0842; G09G 2354/00; G09G 3/3233
See application file for complete search history.

(56) References Cited

U.S. PATENT DOCUMENTS

| | | | | |
|---|---|---|---|---|
| 11,526,246 | B2 | 12/2022 | Chen et al. | |
| 11,869,268 | B2 | 1/2024 | Hu | |
| 2001/0011868 | A1 | 8/2001 | Fukunaga et al. | |
| 2011/0102308 | A1 | 5/2011 | Nakamura et al. | |
| 2011/0285680 | A1 | 11/2011 | Nakamura | |
| 2013/0076723 | A1 | 3/2013 | Niioka et al. | |
| 2013/0082909 | A1 | 4/2013 | Miura et al. | |
| 2013/0293459 | A1 | 11/2013 | Nakamura et al. | |
| 2014/0176893 | A1 | 6/2014 | Sugitani et al. | |
| 2015/0015466 | A1 | 1/2015 | Feng | |
| 2015/0109697 | A1 | 4/2015 | Nagase et al. | |
| 2015/0160754 | A1 | 6/2015 | Wenzel | |
| 2015/0362165 | A1 | 12/2015 | Chu et al. | |
| 2016/0195983 | A1 | 7/2016 | Miyake | |
| 2016/0276421 | A1* | 9/2016 | Lee | H10K 59/121 |
| 2017/0162632 | A1 | 6/2017 | Kim et al. | |
| 2017/0213878 | A1 | 7/2017 | Song et al. | |
| 2017/0221196 | A1 | 8/2017 | Yamaguchi et al. | |
| 2017/0277219 | A1 | 9/2017 | Chung et al. | |
| 2018/0095567 | A1 | 4/2018 | Lee et al. | |
| 2018/0151122 | A1 | 5/2018 | Ding et al. | |
| 2018/0348554 | A1 | 12/2018 | Zhou | |
| 2019/0064960 | A1 | 2/2019 | Na et al. | |
| 2019/0140030 | A1 | 5/2019 | Huangfu et al. | |
| 2019/0213379 | A1 | 7/2019 | Zhao et al. | |
| 2019/0245017 | A1 | 8/2019 | Jeon et al. | |
| 2019/0258338 | A1 | 8/2019 | Park | |
| 2019/0303641 | A1 | 10/2019 | Ko et al. | |
| 2019/0326360 | A1 | 10/2019 | Gwon et al. | |
| 2019/0326361 | A1 | 10/2019 | Gwon et al. | |
| 2019/0341428 | A1 | 11/2019 | Lee et al. | |
| 2020/0004381 | A1 | 1/2020 | Han et al. | |
| 2020/0013833 | A1 | 1/2020 | Wang et al. | |
| 2020/0034600 | A1 | 1/2020 | Chan et al. | |
| 2020/0105841 | A1 | 4/2020 | Bang et al. | |
| 2020/0117304 | A1 | 4/2020 | Lee et al. | |
| 2020/0133414 | A1 | 4/2020 | Lee et al. | |
| 2020/0161398 | A1 | 5/2020 | Bang et al. | |
| 2020/0203453 | A1 | 6/2020 | Kim et al. | |
| 2020/0212124 | A1 | 7/2020 | Shao et al. | |
| 2020/0343477 | A1 | 10/2020 | Zeng et al. | |
| 2020/0363905 | A1 | 11/2020 | Jo et al. | |
| 2021/0013268 | A1 | 1/2021 | Joo et al. | |
| 2021/0066404 | A1 | 3/2021 | Huang | |
| 2021/0149525 | A1 | 5/2021 | Xu et al. | |
| 2021/0232841 | A1 | 7/2021 | Wang et al. | |
| 2021/0320130 | A1 | 10/2021 | Xian et al. | |
| 2021/0326001 | A1 | 10/2021 | Jo et al. | |
| 2021/0328199 | A1 | 10/2021 | Yao et al. | |
| 2021/0335910 | A1 | 10/2021 | Tan et al. | |
| 2021/0343951 | A1 | 11/2021 | Ju | |
| 2021/0376003 | A1 | 12/2021 | Xu et al. | |
| 2021/0397806 | A1* | 12/2021 | Lu | H10K 59/65 |
| 2022/0052139 | A1 | 2/2022 | Xu | |
| 2022/0069027 | A1 | 3/2022 | Wang et al. | |
| 2022/0102444 | A1 | 3/2022 | Ryu et al. | |
| 2022/0199942 | A1 | 6/2022 | Li et al. | |
| 2022/0246893 | A1 | 8/2022 | Hatsumi et al. | |
| 2022/0376215 | A1 | 11/2022 | Gao et al. | |
| 2023/0086115 | A1 | 3/2023 | Takagi | |
| 2023/0214040 | A1 | 7/2023 | Kim et al. | |

FOREIGN PATENT DOCUMENTS

| | | | |
|---|---|---|---|
| CN | 104037201 | A | 9/2014 |
| CN | 205281463 | U | 6/2016 |
| CN | 106598327 | A | 4/2017 |
| CN | 206076238 | U | 4/2017 |
| CN | 109728044 | A | 5/2017 |
| CN | 206209239 | A | 5/2017 |
| CN | 107065360 | A | 8/2017 |
| CN | 107111392 | A | 8/2017 |
| CN | 108288681 | A | 7/2018 |
| CN | 109144311 | A | 1/2019 |
| CN | 110061042 | A | 7/2019 |
| CN | 110137206 | A | 8/2019 |
| CN | 110349528 | A | 10/2019 |
| CN | 110416272 | A | 11/2019 |
| CN | 110518052 | A | 11/2019 |
| CN | 110728267 | A | 1/2020 |
| CN | 111312792 | A | 6/2020 |
| CN | 111415960 | A | 7/2020 |
| CN | 111584599 | A | 8/2020 |
| CN | 111599846 | A | 8/2020 |
| CN | 111668388 | A | 9/2020 |
| CN | 111725264 | A | 9/2020 |
| CN | 111799320 | A | 10/2020 |
| CN | 111831172 | A | 10/2020 |
| CN | 112186022 | A | 1/2021 |
| CN | 112259584 | A | 1/2021 |
| CN | 112363636 | A | 2/2021 |
| CN | 112420955 | A | 2/2021 |
| CN | 112420956 | A | 2/2021 |
| CN | 112534583 | A | 3/2021 |
| CN | 112673477 | A | 4/2021 |
| CN | 112786812 | A | 5/2021 |
| CN | 112786813 | A | 5/2021 |
| CN | 215578574 | U | 1/2022 |
| CN | 215834530 | A | 2/2022 |
| EP | 2 348 388 | A2 | 7/2011 |
| EP | 3 089 149 | A1 | 11/2016 |
| IN | 201947034041 | A | 12/2019 |
| JP | 2011118330 | A | 6/2011 |
| JP | 2011151652 | A | 8/2011 |
| JP | 2016081257 | A | 5/2016 |
| JP | 2017146812 | A | 8/2017 |
| JP | 2019129221 | A | 8/2019 |

(56) References Cited

FOREIGN PATENT DOCUMENTS

| | | | |
|---|---|---|---|
| JP | 2020020849 | A | 2/2020 |
| JP | 2020194158 | A | 12/2020 |
| JP | 2024518006 | A | 4/2024 |
| KR | 10-2019-0037391 | A | 4/2019 |
| WO | 2013191082 | A1 | 12/2013 |
| WO | 2016080046 | A1 | 5/2016 |
| WO | 2019155318 | A1 | 5/2019 |
| WO | 2019218659 | A1 | 11/2019 |
| WO | 2020220302 | A1 | 11/2020 |
| WO | 2020/259647 | A1 | 12/2020 |
| WO | 2021009638 | A1 | 1/2021 |
| WO | 2021102791 | A1 | 6/2021 |

OTHER PUBLICATIONS

U.S. Office Action in U.S. Appl. No. 18/495,255 dated Jul. 18, 2024.
U.S. Office Action in U.S. Appl. No. 17/796,490 dated Apr. 25, 2025.
Chinese Office Action in Chinese Application No. 202180016551.5 dated Jan. 30, 2023 with English translation.
Japanese Office Action in Japanese Application No. 2023-525090 dated Apr. 1, 2025 with English translation.
International Search Report in PCT/CN2021/128697 dated Jan. 27, 2022 with English translation.
Written Opinion in PCT/CN2021/128697 dated Jan. 27, 2022 in Chinese.
Extended European Search Report in European Application No. 21922429.2 dated Aug. 4, 2023.
Extended European Search Report in European Application No. 21922430.0 dated Aug. 7, 2023.
Chinese Office Action in Chinese Application No. 202110726472.5 dated Dec. 20, 2024 with English translation.
Indian Office Action in Indian Application No. 202317029796 dated Mar. 7, 2025 with English translation.
U.S. Office Acion in U.S. Appl. No. 17/800,045 dated Feb. 3, 2025.
Korean Office Action in Korean Application No. 10-2023-7000767 dated Jun. 20, 2025 with English translation.
Chinese Office Action in Chinese Application No. 2021107264725 dated Jun. 30, 2025 with English translation.
Japanese Office Action in Japanese Application No. 2022-558517 dated Jul. 29, 2025 with English translation.
Japanese Office Action in Japanese Application No. 2022-558522 dated Jul. 29, 2025 with English translation.
U.S. Office Action in U.S. Appl. No. 17/789,674 dated Jul. 1, 2025.
Second Korean Office Action in Korean Application No. 10-2023-7001131 dated Dec. 29, 2025 with English translation.
Indian Hearing Notice of Indian Application No. 202217048288 dated Mar. 5, 2026.
U.S. Office Action in U.S. Appl. No. 18/732,894 dated Apr. 20, 2026.
Indian Hearing Notice in Indian Application No. 22217048001 dated Apr. 2, 2026.
U.S. Office Acion in U.S. Appl. No. 18/735,021 dated Jul. 10, 2026.
Japanese Office Action in Japanese Application No. 2025-135060 dated Jul. 28, 2026 with English translation.

* cited by examiner

DISPLAY SUBSTRATE AND DISPLAY DEVICE

CROSS REFERENCE TO RELATED APPLICATIONS

This application is the National Stage of PCT/CN2021/128697 filed on Nov. 4, 2021, which claims priority under 35 U.S.C. § 119 to International Patent Application No. PCT/CN2021/073725, filed on Jan. 26, 2021, and Chinese Patent Application No. 202110726478.2, filed on Jun. 29, 2021, the entire disclosure of which is incorporated herein by reference as part of the present application.

TECHNICAL FIELD

Embodiments of the present disclosure relate to a display substrate and a display device.

BACKGROUND

OLED (Organic Light Emitting Diode) display device has a series of advantages such as self-luminescence, high contrast, high definition, wide viewing angle, low power consumption, fast response speed, and low manufacturing cost, and has become one of the key development directions of the new generation of display devices, so the OLED display device has received more and more attention.

SUMMARY

At least one embodiment of the present disclosure provides a display substrate, the display substrate has a plurality of sub-pixels arranged in a plurality of rows and columns, and comprises a base substrate, a driving circuit layer on the base substrate, a light-emitting device layer on a side of the driving circuit layer away from the base substrate, and a black matrix layer on a side of the light-emitting device layer away from the base substrate, each of the plurality of sub-pixels comprises a pixel driving circuit in the driving circuit layer and a light-emitting device in the light-emitting device layer, and the pixel driving circuit is configured to drive the light-emitting device; the driving circuit layer comprises a first signal line and a second signal line arranged parallel to each other and arranged periodically, and the first signal line and the second signal line are configured to provide different electrical signals to the plurality of sub-pixels; the black matrix layer comprises a plurality of first light-transmitting openings and a plurality of second light-transmitting openings, the plurality of first light-transmitting openings respectively expose light-emitting devices of the plurality of sub-pixels, and the plurality of second light-transmitting openings are respectively arranged between the plurality of first light-transmitting openings; and orthographic projections of the plurality of second light-transmitting openings on the base substrate are respectively between an orthographic projection of one first signal line on the base substrate and an orthographic projection of one second signal line closest to the one first signal line on the base substrate.

For example, in the display substrate provided by at least one embodiment of the present disclosure, the first signal line is a light-emitting control signal line, and the second signal line is a reset voltage line.

For example, in the display substrate provided by at least one embodiment of the present disclosure, the plurality of sub-pixels arranged in a plurality of rows and columns comprise at least one row of first sub-pixels, and at least one row of second sub-pixel adjacent to the one row of first sub-pixels and located at a lower level of the one row of first sub-pixels; pixel driving circuits of the at least one row of first sub-pixels share one light-emitting control signal line and one reset voltage line, and pixel driving circuits of the at least one row of second sub-pixels share one light-emitting control signal line and one reset voltage line; and orthographic projections of one row of second light-transmitting openings on the base substrate are between an orthographic projection of the one light-emitting control signal line shared by the pixel driving circuits of the at least one row of first sub-pixels on the base substrate and an orthographic projection of the one reset voltage line shared by the pixel driving circuits of the at least one row of second sub-pixels on the base substrate.

For example, in the display substrate provided by at least one embodiment of the present disclosure, the driving circuit layer comprises a third signal line and a fourth signal line arranged parallel to each other and arranged periodically, the third signal line and the fourth signal line respectively intersects the first signal line and the second signal line, and the third signal line and the fourth signal line are configured to provide different electrical signals to the plurality of sub-pixels; and the orthographic projections of the plurality of second light-transmitting openings on the base substrate are respectively between an orthographic projection of one third signal line on the base substrate and an orthographic projection of one fourth signal line adjacent to the one third signal line on the base substrate.

For example, in the display substrate provided by at least one embodiment of the present disclosure, the third signal line is a first power supply line, and the fourth signal line is a data line.

For example, in the display substrate provided by at least one embodiment of the present disclosure, the first signal line, the second signal line, the third signal line, and the fourth signal line define a plurality of first regions, and the orthographic projections of the plurality of second light-transmitting openings on the base substrate are respectively within orthographic projections of the plurality of first regions on the base substrate.

For example, in the display substrate provided by at least one embodiment of the present disclosure, the pixel driving circuit comprises a thin film transistor and a storage capacitor, the thin film transistor comprises a gate electrode on the base substrate, the storage capacitor comprises a first capacitor electrode and a second capacitor electrode on the base substrate, and the second capacitor electrode is on a side of the first capacitor electrode away from the base substrate; and the light-emitting control signal line is in a same layer as the gate electrode and the first capacitor electrode.

For example, in the display substrate provided by at least one embodiment of the present disclosure, the reset voltage line is in a same layer as the second capacitor electrode.

For example, the display substrate provided by at least one embodiment of the present disclosure further comprises a planarization layer on a side of the driving circuit layer away from the base substrate and a pixel definition layer on a side of the planarization layer away from the base substrate, the pixel definition layer comprises a plurality of sub-pixel openings; the light-emitting device comprises a first electrode layer, a light-emitting material layer, and a second electrode layer that are sequentially stacked in a direction away from the base substrate, the first electrode layer is on the side of the planarization layer away from the base substrate, the pixel definition layer is on a side of the first electrode layer away from the base substrate, and the plurality of sub-pixel openings respectively expose first electrode layers of the light-emitting devices of the plurality of sub-pixels; the planarization layer comprises a plurality of vias, and the first electrode layers of the light-emitting devices of the plurality of sub-pixels are electrically connected to pixel driving circuits of the plurality of sub-pixels through the plurality of vias, respectively; and a plurality of vias corresponding to a plurality of sub-pixels in a same row comprise a first via, a second via, and a third via, and a first straight line passes through the first via and the second via, but does not pass through the third via.

For example, in the display substrate provided by at least one embodiment of the present disclosure, orthographic projections of at least part of the plurality of vias on the base substrate are respectively within orthographic projections of the plurality of first regions on the base substrate.

For example, the display substrate provided by at least one embodiment of the present disclosure further comprises a plurality of connection electrodes on a side of the planarization layer close to the base substrate, the first electrode layers of the light-emitting devices of the plurality of sub-pixels are electrically connected to the plurality of connection electrodes through the plurality of vias, respectively, and the plurality of connection electrodes are electrically connected to the pixel driving circuits of the plurality of sub-pixels; and orthographic projections of at least part of the plurality of connection electrodes on the base substrate are within orthographic projections of the plurality of first regions on the base substrate.

For example, in the display substrate provided by at least one embodiment of the present disclosure, the plurality of sub-pixels comprise a red sub-pixel, a green sub-pixel, and a blue sub-pixel, and taking one blue sub-pixel, one red sub-pixel, and two green sub-pixels as a repeating unit, the plurality of sub-pixels constitute a plurality of repeating units arranged in a plurality of rows and columns; and four vias corresponding to one blue sub-pixel, one red sub-pixel, and two green sub-pixels in a same row and adjacent to each other are not in a same straight line.

For example, in the display substrate provided by at least one embodiment of the present disclosure, three vias corresponding to three green sub-pixels in a same row and adjacent to each other are not in a same straight line.

For example, in the display substrate provided by at least one embodiment of the present disclosure, a second straight line sequentially passes through a plurality of vias corresponding to a plurality of sub-pixels in a same column.

For example, in the display substrate provided by at least one embodiment of the present disclosure, the driving circuit layer comprises a plurality of light-transmitting portions, and the plurality of light-transmitting portions are capable of transmitting light in a direction perpendicular to a surface of the base substrate; and at least part of the plurality of second light-transmitting openings are in one-to-one correspondence with at least part of the plurality of light-transmitting portions, and are configured to transmit light in a predetermined angle range with the surface of the base substrate.

For example, in the display substrate provided by at least one embodiment of the present disclosure, for a second light-transmitting opening and a light-transmitting portion that are provided corresponding to each other, and in a direction parallel to the surface of the base substrate, a plane shape of the second light-transmitting opening is at least partially same as a plane shape of the light-transmitting portion, and a plane size of the second light-transmitting opening is smaller than a plane size of the light-transmitting portion.

For example, in the display substrate provided by at least one embodiment of the present disclosure, the first signal line, the second signal line, the third signal line, the fourth signal line, and the plurality of connection electrodes together define the plurality of light-transmitting portions.

For example, in the display substrate provided by at least one embodiment of the present disclosure, each sub-pixel of the plurality of sub-pixels is correspondingly provided with one second light-transmitting opening.

For example, in the display substrate provided by at least one embodiment of the present disclosure, for a second light-transmitting opening and a light-transmitting portion that are provided corresponding to each other, and in a direction parallel to the surface of the base substrate, a plane shape of the second light-transmitting opening is circular, a plane shape of the light-transmitting portion is polygonal, and a plane size of the second light-transmitting opening is smaller than a plane size of the light-transmitting portion.

For example, in the display substrate provided by at least one embodiment of the present disclosure, every two sub-pixels of the plurality of sub-pixels are correspondingly provided with one second light-transmitting opening.

For example, in the display substrate provided by at least one embodiment of the present disclosure, a distance between two adjacent second light-transmitting openings in the plurality of second light-transmitting openings ranges from 50 μm to 60 μm.

For example, in the display substrate provided by at least one embodiment of the present disclosure, for a second light-transmitting opening and a light-transmitting portion that are provided corresponding to each other, an orthographic projection of the second light-transmitting opening on the base substrate is within an orthographic projection of the light-transmitting portion on the base substrate.

For example, in the display substrate provided by at least one embodiment of the present disclosure, at least one of the plurality of first light-transmitting openings has an arc-shaped edge.

For example, in the display substrate provided by at least one embodiment of the present disclosure, in a direction parallel to the surface of the base substrate, a plane shape of at least one of the plurality of first light-transmitting openings is elliptical, semi-elliptical, circular, semi-circular, racetrack-shaped, or semi-racetrack-shaped.

For example, in the display substrate provided by at least one embodiment of the present disclosure, in a direction perpendicular to the surface of the base substrate, the plurality of sub-pixel openings are in one-to-one correspondence with and overlapped with the plurality of first light-transmitting openings; and for a sub-pixel opening and a first light-transmitting opening that are provided corresponding to each other, and in a direction parallel to the surface of the base substrate, a plane shape of the sub-pixel opening is same as a plane shape of the first light-transmitting opening.

For example, in the display substrate provided by at least one embodiment of the present disclosure, an orthographic projection of the sub-pixel opening on the base substrate is within an orthographic projection of the first light-transmitting opening on the base substrate.

For example, the display substrate provided by at least one embodiment of the present disclosure further comprises a color film layer, the color film layer comprises a plurality of color film patterns, and the plurality of color film patterns are respectively in the plurality of first light-transmitting openings.

At least one embodiment of the present disclosure further provides a display device, the display device comprises the display substrate provided by the embodiments of the present disclosure.

For example, the display device provided by at least one embodiment of the present disclosure further comprises a texture touch surface and an image sensor array, the image sensor array is on a side of the driving circuit layer away from the light-emitting device layer, and comprises a plurality of image sensors, and the plurality of image sensors are configured to receive light, emitted from a plurality of light-emitting devices in the light-emitting device layer, reflected by a texture on the textured touch surface, and reaching the plurality of image sensors through the plurality of second light-transmitting openings, for texture collection.

At least one embodiment of the present disclosure further provides a display substrate, the display substrate has a plurality of sub-pixels arranged in a plurality of rows and columns, and comprises a base substrate, a driving circuit layer on the base substrate, a light-emitting device layer on a side of the driving circuit layer away from the base substrate, and a black matrix layer on a side of the light-emitting device layer away from the base substrate, each of the plurality of sub-pixels comprises a pixel driving circuit in the driving circuit layer and a light-emitting device in the light-emitting device layer, and the pixel driving circuit is configured to drive the light-emitting device; the driving circuit layer comprises a first signal line and a second signal line arranged parallel to each other and arranged periodically, and the first signal line and the second signal line are configured to provide different electrical signals to the plurality of sub-pixels; the black matrix layer comprises a plurality of first light-transmitting openings and a plurality of second light-transmitting openings, the plurality of first light-transmitting openings respectively expose light-emitting devices of the plurality of sub-pixels, and the plurality of second light-transmitting openings are respectively between the plurality of first light-transmitting openings; orthographic projections of the plurality of second light-transmitting openings on the base substrate are respectively between an orthographic projection of one first signal line on the base substrate and an orthographic projection of one second signal line closest to the one first signal line on the base substrate; the display substrate further comprises a planarization layer on a side of the driving circuit layer away from the base substrate and a pixel definition layer on a side of the planarization layer away from the base substrate, the pixel definition layer comprises a plurality of sub-pixel openings; the light-emitting device comprises a first electrode layer, a light-emitting material layer, and a second electrode layer that are sequentially stacked in a direction away from the base substrate, the first electrode layer is on the side of the planarization layer away from the base substrate, the pixel definition layer is on a side of the first electrode layer away from the base substrate, and the plurality of sub-pixel openings respectively expose first electrode layers of the light-emitting devices of the plurality of sub-pixels; the planarization layer comprises a plurality of vias, and the first electrode layers of the light-emitting devices of the plurality of sub-pixels are electrically connected to pixel driving circuits of the plurality of sub-pixels through the plurality of vias, respectively; and a plurality of vias corresponding to a plurality of sub-pixels in a same row comprise a first via, a second via, and a third via, and a first straight line passes through the first via and the second via, but does not pass through the third via.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1:
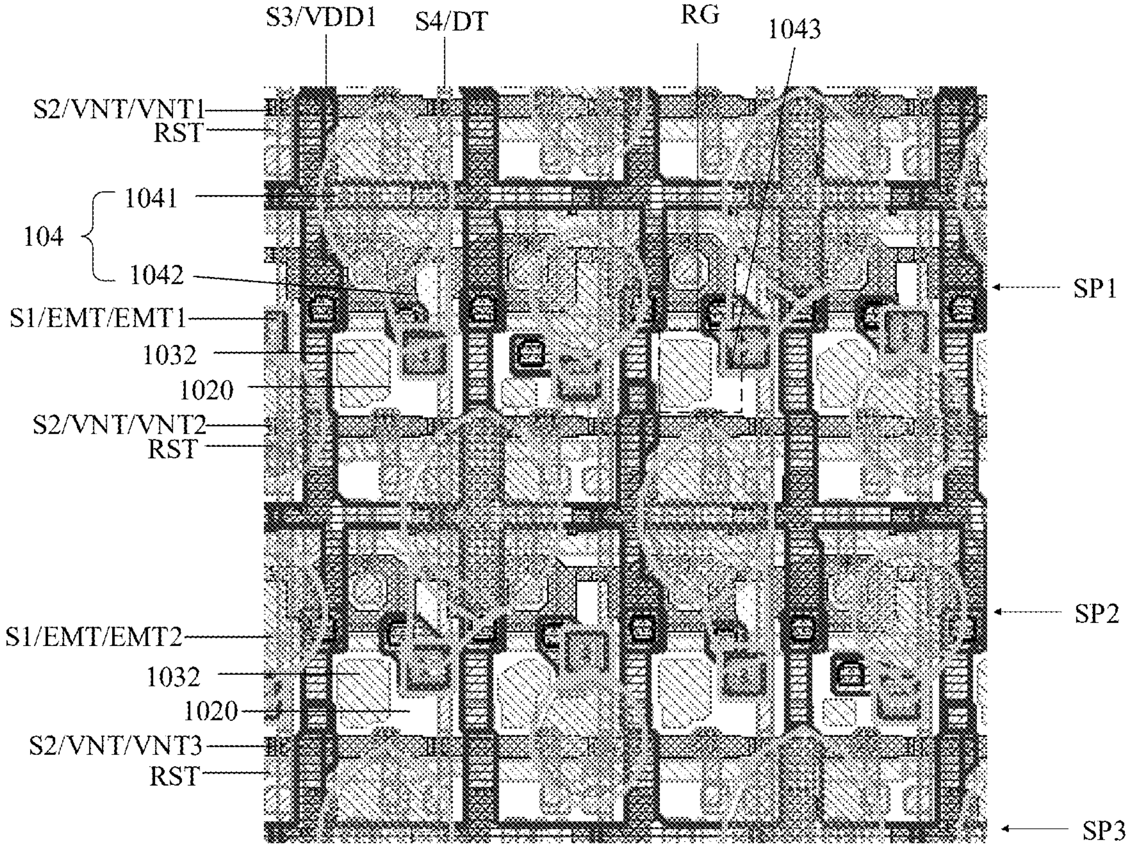
FIG. 1 is a schematic partial plan view of a display substrate provided by at least one embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," and similar terms are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The terms "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In order to prevent the screen from reflecting light, in the traditional OLED display substrate, a layer of polarizer is usually attached on the display substrate to improve the use comfort of the display substrate under ambient light. However, the inventors of the present disclosure found that the transmittance of the polarizer is usually only about 40%, resulting in a low light extraction rate of the display substrate, which in turn leads to a higher power consumption of the display substrate.

In some embodiments, the COE (Cover film On Encapsulation) technology, that is, a technology that uses a color film (CF) to replace the polarizer, can be used to improve the light extraction rate of the display substrate, and this technology is beneficial to the development of the display substrate in the direction of high integration and thinness. In the COE technology, a black matrix layer is formed on the display substrate, and the black matrix layer has a light-transmitting opening at the position corresponding to a light-emitting device of a sub-pixel to transmit the light emitted by the light-emitting device of the sub-pixel, and the above-mentioned color film is provided in this light-transmitting opening. In this case, the black matrix layer can absorb light, thereby blocking part of the metals in the display substrate and reducing the light reflectivity of the display substrate. Furthermore, the non-display side of the display substrate is usually provided with a photosensitive element, such as an image sensor, etc., to realize functions such as fingerprint recognition, and the like; in this case, the display substrate also needs to have a certain light transmittance, so that the signal light incident from the display side of the display substrate can pass through the display substrate to reach the non-display side of the display substrate. However, it is difficult for the current display substrate structure to obtain a light-transmitting region that can transmit the signal light, so it is necessary to reconfigure part structure of the display substrate so that the display substrate can transmit the signal light.

At least one embodiment of the present disclosure provides a display substrate and a display device, the display substrate has a plurality of sub-pixels arranged in a plurality of rows and columns, and includes a base substrate, a driving circuit layer on the base substrate, a light-emitting device layer on a side of the driving circuit layer away from the base substrate, and a black matrix layer on a side of the light-emitting device layer away from the base substrate. Each of the plurality of sub-pixels includes a pixel driving circuit in the driving circuit layer and a light-emitting device in the light-emitting device layer, and the pixel driving circuit is configured to drive the light-emitting device. The driving circuit layer includes a first signal line and a second signal line arranged parallel to each other and arranged periodically, and the first signal line and the second signal line are configured to provide different electrical signals to the plurality of sub-pixels. The black matrix layer includes a plurality of first light-transmitting openings and a plurality of second light-transmitting openings, the plurality of first light-transmitting openings respectively expose light-emitting devices of the plurality of sub-pixels, and the plurality of second light-transmitting openings are respectively arranged between the plurality of first light-transmitting openings. Orthographic projections of the plurality of second light-transmitting openings on the base substrate are respectively located between an orthographic projection of one first signal line on the base substrate and an orthographic projection of one second signal line closest to the one first signal line on the base substrate.

In the above-mentioned display substrate provided by at least one embodiment of the present disclosure, the black matrix layer has a plurality of second light-transmitting openings, and the plurality of second light-transmitting openings can be configured for transmitting light, for example, transmitting signal light for photosensitive elements. In addition, in the direction parallel to the surface of the base substrate, the plurality of second light-transmitting openings are arranged between one first signal line and one second signal line closest to the one first signal line. In this case, a larger light-transmitting region is formed between the first signal line and the second signal line closest to the first signal line, so the second light-transmitting opening also has a sufficient size at this position to fully transmit light, and does not affect the display effect of the display substrate.

Hereinafter, the display substrate and the display device provided by the embodiments of the present disclosure will be described in detail through several specific examples.

At least one embodiment of the present disclosure provides a display substrate. FIG. 1 shows a schematic partial plan view of the display substrate, FIG. 2 shows a schematic partial cross-sectional view of the display substrate, and FIG. 3 shows a schematic partial plan view of a pixel definition layer and a black matrix layer of the display substrate.

Figure 2:
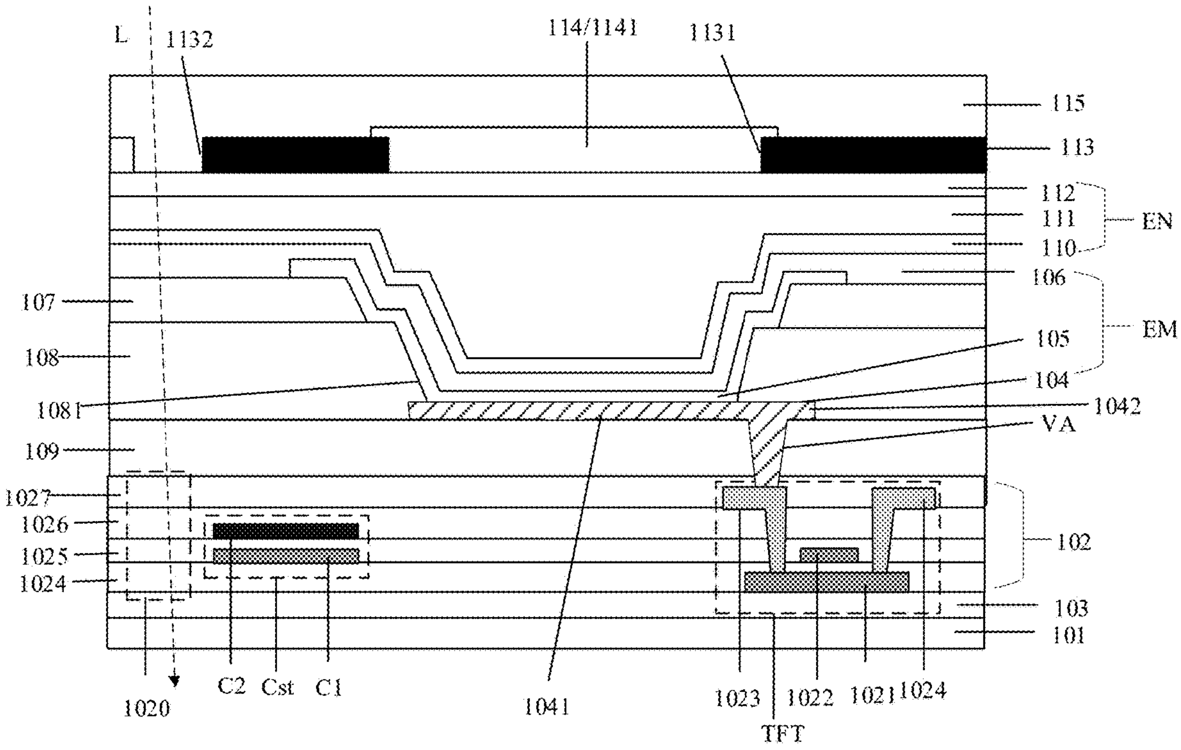
FIG. 2 is a schematic partial cross-sectional view of a display substrate provided by at least one embodiment of the present disclosure.
Figure 3:
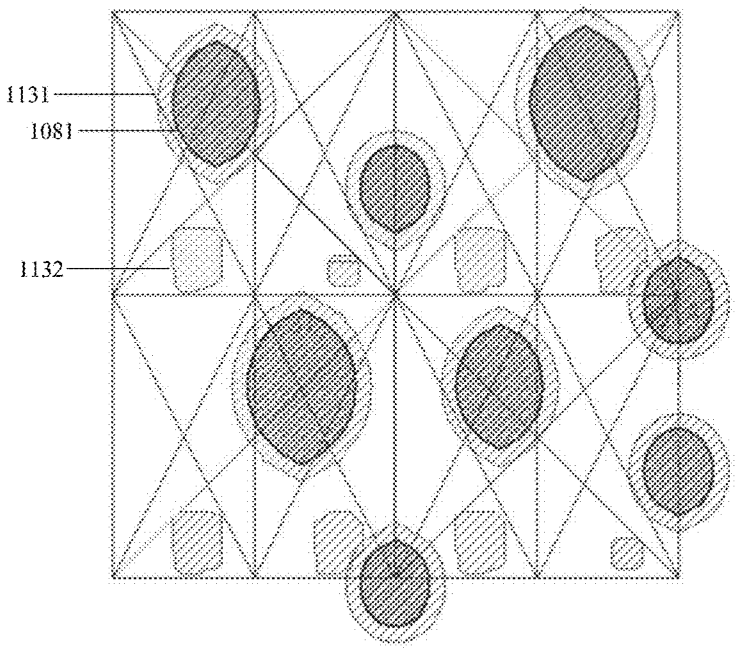
FIG. 3 is a schematic partial plan view of a pixel definition layer and a black matrix layer of a display substrate provided by at least one embodiment of the present disclosure.

As shown in FIG. 1 to FIG. 3, the display substrate has a plurality of sub-pixels SP arranged in a plurality of rows and columns, and includes a base substrate 101, a driving circuit layer 102 provided on the base substrate, a light-emitting device layer provided on a side of the driving circuit layer 102 away from the base substrate 101, and a black matrix layer 113 provided on a side of the light-emitting device layer away from the base substrate 101.

For example, each sub-pixel includes a pixel driving circuit provided in the driving circuit layer 102 and a light-emitting device EM provided in the light-emitting device layer, and the pixel driving circuit is electrically connected to the light-emitting device EM, and is configured to drive the light-emitting device EM. For example, as shown in FIG. 1, the driving circuit layer 102 includes a first signal line S1 and a second signal line S2 arranged parallel to each other and arranged periodically, and the first signal line S1 and the second signal line S2 are configured to provide different electrical signals to the plurality of sub-pixels SP.

It should be noted that, considering the process errors and structural errors in actual production, the formed signal line may not be a straight line, such as having uneven parts, etc. In the embodiments of the present disclosure, the first signal line S1 and the second signal line S2 are "parallel to each other" may mean that the angle formed between the extending directions of the first signal line S1 and the second signal line S2 is within a range of 0-15 degrees, but not necessarily parallel in the strict sense.

For example, as shown in FIG. 1 to FIG. 3, the black matrix layer includes a plurality of first light-transmitting openings 1131 and a plurality of second light-transmitting openings 1132, and the plurality of first light-transmitting openings 1131 respectively expose light-emitting devices EM of a plurality of sub-pixels, so as to transmit the light emitted by the light-emitting devices EM of the plurality of sub-pixels respectively. The plurality of second light-transmitting openings 1132 are respectively arranged between the plurality of first light-transmitting openings 1131, as shown in FIG. 1, the orthographic projections of the plurality of second light-transmitting openings 1132 on the base substrate 101 are respectively located between the orthographic projection of one first signal line S1 on the base substrate 101 and the orthographic projection of one second signal line S2 closest to the one first signal line S1 on the base substrate 101.

For example, in some embodiments, the first signal line S1 is a light-emitting control signal line EMT, and the second signal line is a reset voltage line VNT, which will be described in detail later.

For example, in some embodiments, the plurality of sub-pixels SP arranged in a plurality of rows and columns include at least one row of first sub-pixels SP1 (the figure shows one row of first sub-pixel SP1 as an example) and at least one row of second sub-pixels SP2 (the figure shows one row of second sub-pixel SP2 as an example) adjacent to the at least one row of first sub-pixels SP1 and located at a lower level (that is, located at a next row of the at least one row of first sub-pixels SP1 or scanned after the at least one row of first sub-pixels SP1 during circuit scanning) of the at least one row of first sub-pixels SP1. The pixel driving circuits of the at least one row of first sub-pixels SP1 share one light-emitting control signal line EMT1 and one reset voltage line VNT1, and the pixel driving circuits of the at least one row of second sub-pixels SP2 share one light-emitting control signal line EMT2 and one reset voltage line VNT2. In this case, the orthographic projections of one row of second light-transmitting openings 1132 on the base substrate 101 are between the orthographic projection of the light-emitting control signal line EM1 shared by the pixel driving circuits of the at least one row of first sub-pixels SP1 on the base substrate 101 and the orthographic projection of the reset voltage line VNT2 shared by the pixel driving circuits of the at least one row of second sub-pixels SP2 on the base substrate 101.

For example, in other embodiments, the pixel driving circuits of a plurality of rows of first sub-pixels SP1 share one light-emitting control signal line EMT1 and one reset voltage line VNT1, and the pixel driving circuits of a plurality of rows of second sub-pixels SP2 share one light-emitting control signal line EMT2 and one reset voltage line VNT2. In this case, the orthographic projections of one row of second light-transmitting openings 1132 on the base substrate 101 are between the orthographic projection of the light-emitting control signal line EM1 shared by the pixel driving circuits of the plurality of rows of first sub-pixels SP1 on the base substrate 101 and the orthographic projection of the reset voltage line VNT2 shared by the pixel driving circuits of the plurality of rows of second sub-pixels SP2 on the base substrate 101.

For example, as shown in FIG. 1, the plurality of sub-pixels SP arranged in a plurality of rows and columns further include at least one row of third sub-pixels SP3 (the figure shows one row of the third sub-pixel SP3 as an example) adjacent to the at least one row of second sub-pixels SP2 and located at a lower level of the at least one row of the second sub-pixels SP2, and the pixel driving circuits of the at least one row of third sub-pixels SP3 share one light-emitting control signal line (not shown in the figure) and one reset voltage line VNT3. In this case, the orthographic projections of one row of second light-transmitting openings 1132 on the base substrate 101 are between the orthographic projection of the light-emitting control signal line EMT2 shared by the pixel driving circuits of the at least one row of second sub-pixels SP2 on the base substrate 101 and the orthographic projection of the reset voltage line VNT3 shared by the pixel driving circuits of the at least one row of third sub-pixels SP3 on the base substrate 101.

For example, in some embodiments, as shown in FIG. 1 and FIG. 2, the driving circuit layer 102 includes a plurality of light-transmitting portions 1020, and the plurality of light-transmitting portions 1020 are capable of transmitting light in a direction perpendicular to the surface of the base substrate 101. For example, at least part of the second light-transmitting openings 1132 are provided in one-to-one correspondence with at least part of the light-transmitting portions 1020, and are configured to transmit light which is in a predetermined angle range with the surface of the base substrate 101. For example, as shown in FIG. 2, the light L can reach a non-display side (i.e., the lower side in the figure) of the display substrate through the second light-transmitting opening 1132 and the light-transmitting portion 1020 in sequence from a display side (i.e., the upper side in the figure) of the display substrate, so that a photosensitive element, such as an image sensor, provided on the non-display side of the display substrate can receive light and work.

For example, as shown in FIG. 1, in the direction parallel to the base substrate 101, one row of light-transmitting portions 1020 are between the light-emitting control signal line EM1 shared by the pixel driving circuits of at least one row of first sub-pixels SP1 and the reset voltage line VNT2 shared by the pixel driving circuits of at least one row of second sub-pixels SP2, and one row of light-transmitting portions 1020 are between the light-emitting control signal line EMT2 shared by the pixel driving circuits of at least one row of second sub-pixels SP2 and the reset voltage line VNT3 shared by the pixel driving circuits of at least one row of third sub-pixels SP3. In this case, the light-transmitting portion 1020 has a larger area between the light-emitting control signal line and the reset voltage line, so as to cooperate with the second light-transmitting opening 1132 to achieve the effect of sufficient light-transmitting.

For example, as shown in FIG. 1, the driving circuit layer includes a third signal line S3 and a fourth signal line S4 arranged parallel to each other and arranged periodically, and the third signal line S3 and the fourth signal line S4 respectively intersect the first signal line S1 and the second signal line S2, for example, perpendicular to the first signal line S1 and the second signal line S2. The third signal line S3 and the fourth signal line S4 are configured to provide different electrical signals to the plurality of sub-pixels, and the orthographic projections of the plurality of second light-transmitting openings 1032 on the base substrate 101 are respectively located between the orthographic projection of one third signal line S3 on the base substrate 101 and the orthographic projection of one fourth signal line S4 adjacent to the one third signal line S3 on the base substrate 101.

For example, in some embodiments, the third signal line S3 is a first power supply line VDD1, and the fourth signal line S4 is a data line DT, which will be described in detail later.

For example, as shown in FIG. 1, the first signal line S1, the second signal line S2, the third signal line S3, and the fourth signal line S4 define a plurality of first regions RG, that is, the regions circled by the dotted frame in the figure, and the orthographic projections of the plurality of second light-transmitting openings 1032 on the base substrate 101 are respectively located within the orthographic projections of the plurality of first regions RG on the base substrate 101. For example, in some examples, as shown in FIG. 1, for a second light-transmitting opening 1132 and a light-transmitting portion 1020 that are provided corresponding to each other, and in the direction parallel to the surface of the base substrate 101, the plane shape of the second light-transmitting opening 1132 is at least partially the same as the plane shape of the light-transmitting portion 1020. For example, as shown in FIG. 1, at least part of the outline of the second light-transmitting opening 1132 is along the outline of the light-transmitting portion 1020, and the plane size of the second light-transmitting opening 1132 is smaller than the plane size of the light-transmitting portion 1020. For example, for the second light-transmitting opening 1132 and the light-transmitting portion 1020 that are provided corresponding to each other, the orthographic projection of the second light-transmitting opening 1132 on the base substrate 101 is located inside/within the orthographic projection of the light-transmitting portion 1020 on the base substrate 101.

For example, in some embodiments, as shown in FIG. 1, each sub-pixel SP is correspondingly provided with one second light-transmitting opening 1132, so that the display substrate has a sufficient number and size of the second light-transmitting openings 1132 to achieve the effect of sufficient light-transmitting.

For example, as shown in FIG. 2, the pixel driving circuit includes at least one thin film transistor TFT and a storage capacitor Cst, and the thin film transistor TFT includes an active layer 1021, a gate electrode 1022, a source electrode 1023, a drain electrode 1024, and the like provided on the base substrate 101. The source electrode 1023 of the thin film transistor TFT is electrically connected to the first electrode layer 104 of the light-emitting device EM. The storage capacitor Cst includes a first capacitor electrode C1 and a second capacitor electrode C2 provided on the base substrate 101, and the second capacitor electrode C2 is provided on a side of the first capacitor electrode C1 away from the base substrate 101. For example, in some embodiments, the light-emitting control signal line EMT is provided in the same layer as the gate electrode 1022 and the first capacitor electrode C1. For example, in some embodiments, the reset voltage line VNT is provided in the same layer as the second capacitor electrode C2.

For example, the pixel driving circuit is formed into a 2T1C (two thin film transistors and one storage capacitor) structure, a 6T1C (six thin film transistors and one storage capacitor) structure, or the like, and therefore include a plurality of thin film transistors, and the plurality of thin film transistors have a stacked structure similar or identical to that of the thin film transistor shown in FIG. 2. FIG. 2 only shows the thin film transistor directly connected to the light-emitting device, and the thin film transistor may be a driving thin film transistor, or a light-emitting control thin film transistor, or the like.

It should be noted that, in the embodiments of the present disclosure, "provided in the same layer" means that two or more functional layers (or structural layers) are formed in the same layer and with the same material in the hierarchical structure of the display substrate, that is, during the manufacturing process, the two or more functional layers (or structural layers) are formed by the same material layer, and the required patterns and structures are formed by the same patterning process.

In addition, as shown in FIG. 2, the display panel further includes a buffer layer 103 provided on the base substrate 101, a first gate insulating layer 1024 provided on the active layer 1021, a second gate insulating layer 1025 provided on the gate electrode 1022 and the first capacitor electrode C1, an interlayer insulating layer 1026 provided on the second capacitor electrode CE2, a passivation layer 1027 provided on the source electrode 1023 and the drain electrode 1024, and the like. For example, the plurality of light-transmitting portions 1020 include a light-transmitting insulating material, and the light-transmitting insulating material includes the light-transmitting insulating material of an insulating layer such as the first gate insulating layer 1024, the second gate insulating layer 1025, the interlayer insulating layer 1026, the passivation layer 1027, or the like.

For example, in some embodiments, as shown in FIG. 2, the display substrate further includes a planarization layer 109 provided on the side of the driving circuit layer 102 away from the base substrate 101 and a pixel definition layer 108 located on a side of the planarization layer 109 away from the base substrate 101. The pixel definition layer 108 includes a plurality of sub-pixel openings 1081, and the light-emitting device EM includes a first electrode layer 104, a light-emitting material layer 105, and a second electrode layer 106 that are sequentially stacked in the direction away from the base substrate 101. The first electrode layer 104 is provided on the side of the planarization layer 109 away from the base substrate 101, the pixel definition layer 108 is provided on the side of the first electrode layer 104 away from the base substrate 101, and the plurality of sub-pixel openings 1081 are respectively expose the first electrode layers 104 of the light-emitting devices EM of the plurality of sub-pixels. For example, the planarization layer 109 includes a plurality of vias VA, and the first electrode layers 104 of the light-emitting devices EM of the plurality of sub-pixels are electrically connected to the pixel driving circuits of the plurality of sub-pixels through the plurality of vias VA, respectively.

For example, in some embodiments, as shown in FIG. 1 and FIG. 2, the first electrode layer 104 includes a main body portion 1041 and a connection portion 1042, the connection portion 1042 is configured to be electrically connected to the pixel driving circuit, for example, electrically connected to the pixel driving circuit through the via VA in the planarization layer 109, and at least part of the main body portion 1041 is exposed by the sub-pixel opening 1081.

Figure 4:
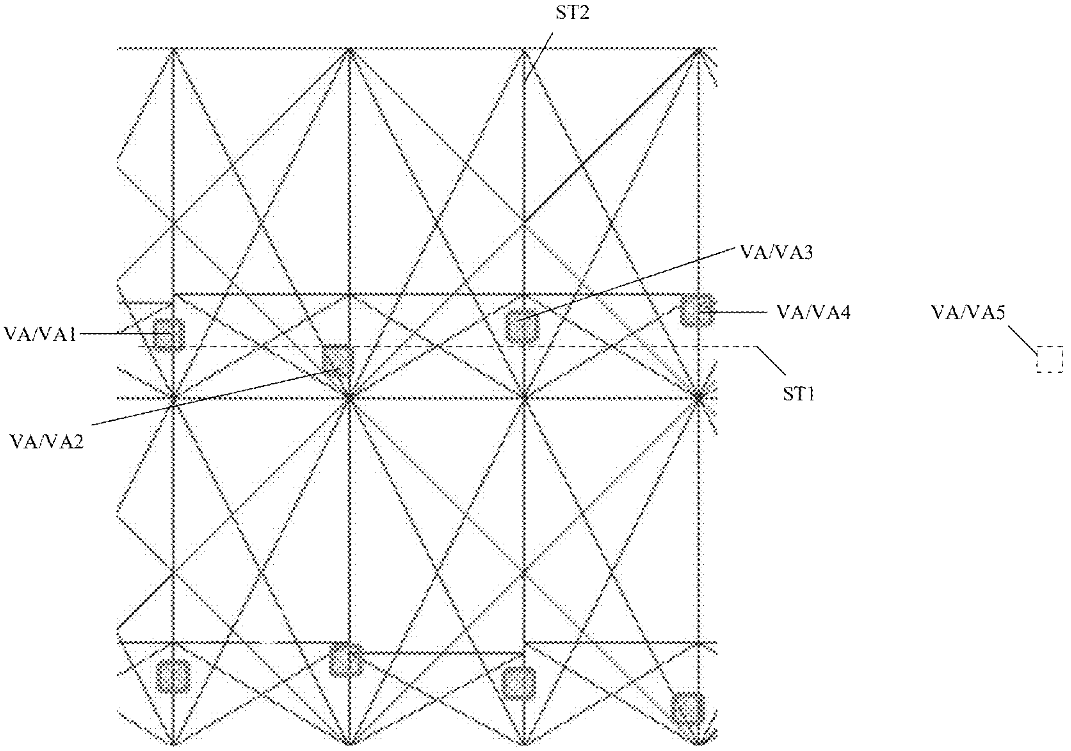
FIG. 4 is a schematic partial plan view of a planarization layer of a display substrate provided by at least one embodiment of the present disclosure.

For example, FIG. 4 shows a plan layout diagram of the plurality of vias VA of the planarization layer 109. In conjunction with FIG. 1 and FIG. 4, three vias VA corresponding to at least three adjacent sub-pixels located in the same row are not arranged in the same straight line, that is, the positions of the three vias VA corresponding to at least three adjacent sub-pixels are offset from each other so that one straight line cannot pass through the three vias VA corresponding to at least three adjacent sub-pixels.

For example, as shown in FIG. 4, the plurality of vias VA corresponding to the plurality of sub-pixels located in the same row include a first via VA1, a second via VA2, and a third via VA3, and there is a first straight line ST1 passing through the first via VA1 and the second via VA2, but not passing through the third via VA3. For example, the extending direction of the first straight line ST1 is parallel to the extending directions of the first signal line S1 and the second signal line S2, and is shown as the horizontal direction in the figure.

For example, referring to FIG. 1 and FIG. 4, the orthographic projections of at least part of the plurality of vias VA on the base substrate 101 are respectively located within the orthographic projections of the plurality of first regions RG on the base substrate 101, that is, the orthographic projections of the plurality of vias VA on the base substrate 101 have overlapping portions with the orthographic projections of the plurality of first regions RG on the base substrate 101, or the orthographic projections of the plurality of vias VA on the base substrate 101 are respectively located within the orthographic projections of the plurality of first regions RG on the base substrate 101.

In the embodiments of the present disclosure, by designing the plurality of vias VA of the planarization layer 109 not to be in a straight line, the lines of the pixel driving circuit can be avoided from a larger light-transmitting region to form a sufficient area of the light-transmitting portion 1020.

For example, in some embodiments, the plurality of sub-pixels include a red sub-pixel, a green sub-pixel, and a blue sub-pixel, and taking one blue sub-pixel, one red sub-pixel, and two green sub-pixels as a repeating unit, the plurality of sub-pixels constitute a plurality of repeating units arranged in a plurality of rows and columns. For example, as shown in FIG. 4, four vias VA1-VA4 corresponding to one blue sub-pixel, one red sub-pixel, and two green sub-pixels that are adjacent to each other and in the same row are not arranged in the same straight line. For example, in FIG. 4, the red sub-pixel corresponds to the via VA1, the two green sub-pixels correspond to the vias VA2 and VA4, and the blue sub-pixel corresponds to the via VA3.

For example, in some embodiments, three vias corresponding to three adjacent green sub-pixels located in the same row are not arranged in the same straight line. For example, FIG. 4 shows two vias VA2 and VA4 corresponding to two adjacent green sub-pixels located in the same row and belonging to the same repeating unit, and the position of the via VA5 corresponding to the green sub-pixel on the right side of the via VA4 in the figure is shown by a dotted frame. In this case, the three vias VA2, VA4 and VA5 corresponding to the three adjacent green sub-pixels located in the same row are not arranged in the same straight line.

For example, as shown in FIG. 4, a plurality of vias corresponding to a plurality of sub-pixels located in the same column are arranged in the same straight line, that is, one straight line can pass through the plurality of vias VA corresponding to the plurality of sub-pixels located in the same column. As shown in FIG. 4, there is a second straight line ST2 sequentially passing through the plurality of vias VA corresponding to the plurality of sub-pixels located in the same column. For example, the extending direction of the second straight line ST2 is parallel to the extending directions of the third signal line S3 and the fourth signal line S4, which is shown as a vertical direction in the figure. Thereby, the plurality of sub-pixels are aligned in the column direction.

For example, in some embodiments, as shown in FIG. 2, the display substrate further includes other structures such as a spacer 107 provided on the pixel definition layer 108 and an encapsulation layer EN provided on the light-emitting device EM of the sub-pixel. For example, the encapsulation layer EN includes a plurality of sub-encapsulation layers to improve its encapsulation effect. For example, the encapsulation layer EN is a composite encapsulation layer, including a first inorganic encapsulation layer 110, a second organic encapsulation layer 111, and a third inorganic encapsulation layer 112. For example, the first inorganic encapsulation layer 110 and the third inorganic encapsulation layer 112 are formed of an inorganic material such as silicon nitride, silicon oxide, silicon oxynitride, or the like, and the second organic encapsulation layer 111 is formed of an organic material such as polyimide (PI), epoxy resin, or the like. The composite encapsulation layer can form multiple protections for the functional structures on the display panel, and has better encapsulation effect.

Figure 5:
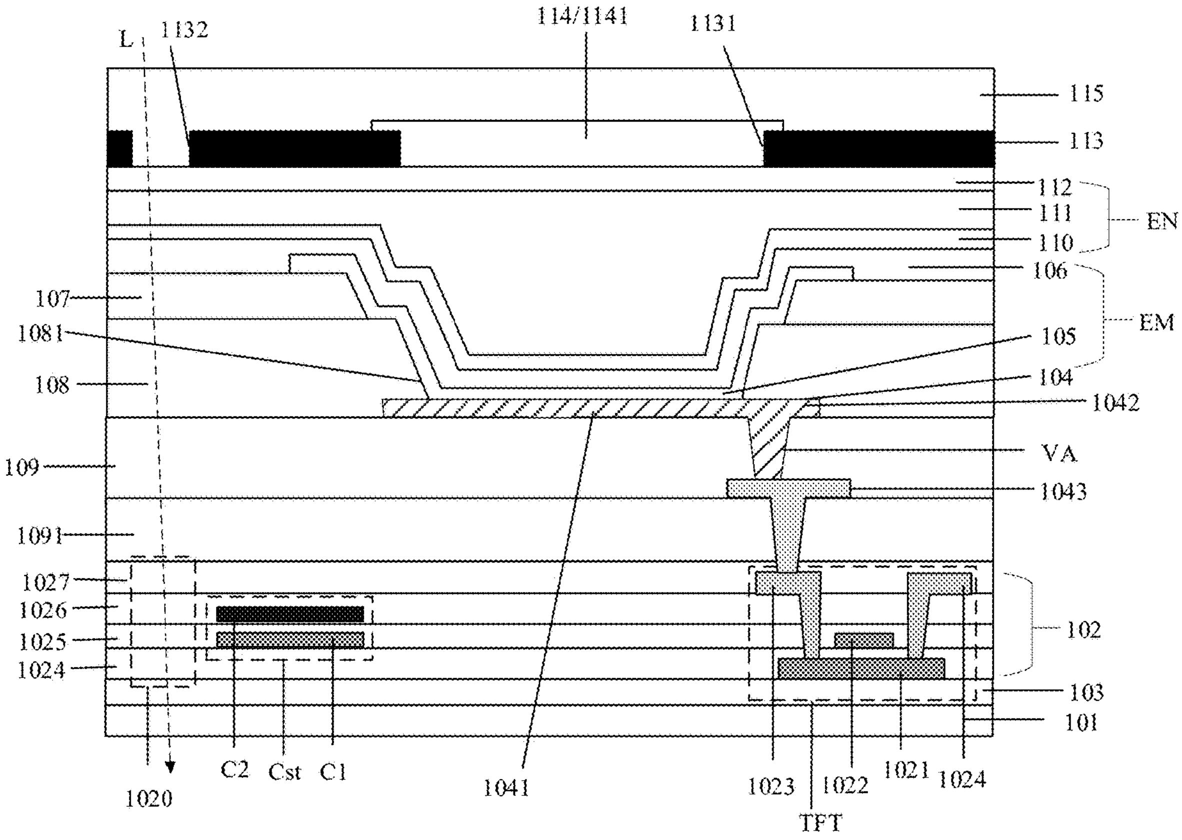
FIG. 5 is another schematic partial cross-sectional view of a display substrate provided by at least one embodiment of the present disclosure.

For example, FIG. 5 shows another schematic partial cross-sectional view of a display substrate provided by at least one embodiment of the present disclosure. In this embodiment, as shown in FIG. 5, the display substrate further includes a connection electrode 1043, the connection electrode 1043 is provided on the side of the planarization layer 109 close to the base substrate 101, and the connection portion 1042 of the first electrode layer 104 of the light-emitting device EM is electrically connected to the pixel driving circuit through the connection electrode 1043. In this case, the connection portion 1042 of the first electrode layer 104 is connected to the connection electrode 1043 through the via VA in the planarization layer 109, and the connection electrode 1043 is connected to the source electrode 1023 of the thin film transistor TFT through the via in another planarization layer 1091.

Figure 12A:
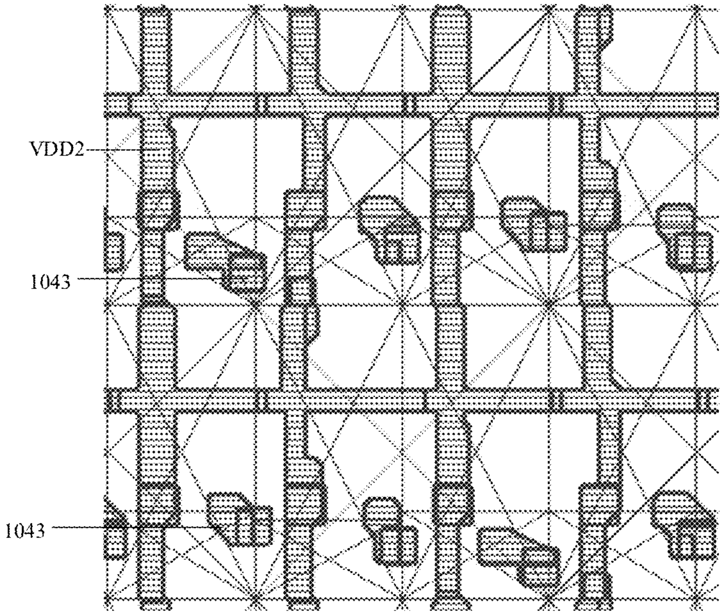

For example, as shown in FIG. 1, the orthographic projections of at least part of the plurality of connection electrodes 1043 (FIG. 12A shows a schematic plan view of the plurality of connection electrodes 1043) on the base substrate 10 are located within the orthographic projections of the plurality of first regions RG on the base substrate 10, that is, the orthographic projections of the plurality of connection electrodes 1043 on the base substrate 10 have overlapping portions with the orthographic projections of the plurality of first regions RG on the base substrate 10, or the orthographic projections of the plurality of connection electrodes 1043 on the base substrate 10 are respectively located inside/within the orthographic projections of the plurality of first regions RG on the base substrate 10, referring to FIG. 1.

For example, as shown in FIG. 1, the first signal line S1, the second signal line S2, the third signal line S3, the fourth signal line S4, and the plurality of connection electrodes 1043 together define a plurality of light-transmitting portions 1020, that is, the regions surrounded by the first signal line S1, the second signal line S2, the third signal line S2, the fourth signal line S4, and the plurality of connection electrodes 1043 are the plurality of light-transmitting portions 1020.

In this embodiment, the vias VA in the planarization layer 109 have the same arrangement as that in FIG. 4, and details are not described herein again. For other structures of the display substrate shown in FIG. 5, reference may be made to the display substrates shown in FIG. 1 to FIG. 3, and details are not described herein again.

For example, in the embodiments of the present disclosure, the base substrate 101 includes a flexible insulating material such as polyimide (PI) or a rigid insulating material such as a glass substrate. For example, in some examples, the base substrate 101 is a stacked structure in which a plurality of flexible layers and a plurality of barrier layers are alternately arranged. In this case, the flexible layer may include polyimide, and the barrier layer may include an inorganic insulating material such as silicon oxide, silicon nitride, silicon oxynitride, or the like. For example, the buffer layer 103 may include an inorganic material such as silicon nitride, silicon oxide, silicon oxynitride, or the like. The active layer 1021 is made of a material such as polysilicon, metal oxide, or the like, and the first gate insulating layer 1024 and the second gate insulating layer 1025 are made of an inorganic insulating material such as silicon oxide, silicon nitride, silicon oxynitride, or the like. The gate electrode 1022 and the first capacitor electrode C1 are made of a metal material such as copper, aluminum, titanium, cobalt, or the like, for example, they are formed into a single-layer structure or a multi-layer structure, for example a multi-layer structure such as titanium/aluminum/titanium, molybdenum/aluminum/molybdenum, or the like. The second capacitor electrode C2 is made of a metal such as copper, aluminum, titanium, cobalt, or the like, or an alloy material; the interlayer insulating layer 1026 is made of an inorganic insulating material such as silicon oxide, silicon nitride, silicon oxynitride, or the like; and the passivation layer 1027 is made of an inorganic insulating material such as silicon oxide, silicon nitride, silicon oxynitride, or the like. The source and drain electrodes 1023 and 1024 are made of a metal material such as copper, aluminum, titanium, cobalt, or the like, for example, are formed into a single-layer structure or a multi-layer structure, for example a multi-layer structure such as titanium/aluminum/titanium, molybdenum/aluminum/molybdenum, or the like. The first electrode layer 104 is, for example, an anode layer, including a metal oxide such as ITO, IZO, or the like, or a metal such as Ag, Al, Mo, or the like, or their alloys. The material of the light-emitting material layer 105 is an organic light-emitting material. For example, the material of the light-emitting material layer 105 is selected as a light-emitting material that can emit light of a certain color (e.g., red light, blue light, or green light, etc.) according to requirements. The second electrode layer 106 is, for example, a cathode layer, including a metal such as Mg, Ca, Li, Al, or the like, or their alloys, or a metal oxide such as IZO, ZTO, or the like, or an organic material with conductive such properties as PEDOT/PSS (poly3, 4-ethylenedioxythiophene/polystyrene sulfonate), or the like. The planarization layer 109 (and the planarization layer 1091), the pixel definition layer 108, and the spacer 107 are made of an organic insulating material such as polyimide or the like. The embodiments of the present disclosure do not specifically limit the material of each functional layer.

Figure 6:
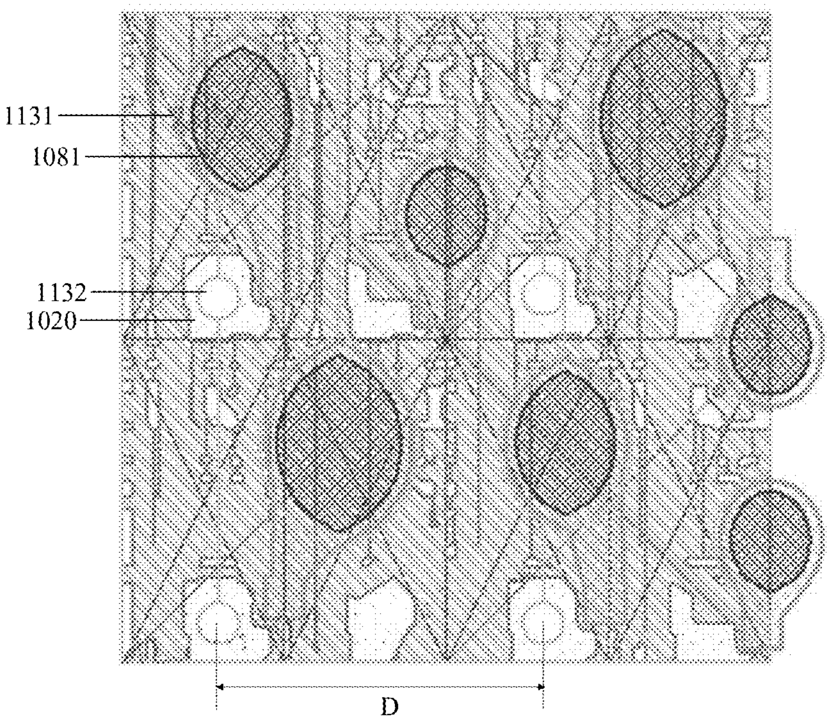
FIG. 6 is another schematic plan view of a display substrate provided by at least one embodiment of the present disclosure.

For example, FIG. 6 shows another schematic partial plan view of a display substrate provided by at least one embodiment of the present disclosure. In this embodiment, as shown in FIG. 6, for the second light-transmitting opening 1132 and the light-transmitting portion 1020 that are provided corresponding to each other, and in the direction parallel to the surface of the base substrate 101, the plane shape of the second light-transmitting opening 1032 is circular, the plane shape of the light-transmitting portion 1020 is polygonal, and the plane size of the second light-transmitting opening 1132 is smaller than the plane size of the light-transmitting portion 1020.

For example, as shown in FIG. 6, for the second light-transmitting opening 1132 and the light-transmitting portion 1020 that are provided corresponding to each other, the orthographic projection of the second light-transmitting opening 1132 on the base substrate 101 is located within the orthographic projection of the light-transmitting portion 1020 on the base substrate 101. In this case, the second light-transmitting opening 1132 can transmit light in the form of a small hole (aperture), and the photosensitive element located on the non-display side of the display substrate, such as an image sensor, can perform fingerprint recognition based on the aperture imaging principle.

For example, in the embodiment shown in FIG. 6, one second light-transmitting opening 1132 is correspondingly provided for every two sub-pixels, so as to meet the requirements of aperture imaging. For example, in some examples, the distance D between two adjacent second light-transmitting openings 1132 in the plurality of second light-transmitting openings 1132 ranges from 50 μm to 60 μm, such as 52 μm, 55 μm, 58 μm, or the like. For example, the distance between two adjacent second light-transmitting openings 1132 located in the same row or the distance between two adjacent second light-transmitting openings 1132 located in the same column ranges from 50 μm to 60 μm.

For example, for other structures of the display substrate shown in FIG. 6, reference may be made to the descriptions of the display substrates in FIG. 1 to FIG. 3, which will not be repeated here.

For example, in some embodiments, as shown in FIG. 3 and FIG. 6, at least one (e.g., each) of the plurality of first light-transmitting openings 1311 has an arc-shaped edge. For example, in some examples, and in the direction parallel to the surface of the base substrate 101, the plane shape of at least one (e.g., each) of the plurality of first light-transmitting openings 1131 is elliptical (or mango-shaped), semi-elliptical, circular, semi-circular, racetrack-shaped, semi-racetrack-shaped, or a deformed shape thereof.

In the embodiments of the present disclosure, the first light-transmitting opening 1131 with an arc-shaped edge can reduce or even eliminate the phenomenon that the external light diffracts at the edge of the first light-transmitting opening 1131 of the black matrix layer 113 to cause color separation of the display substrate, thereby improving the display effect of the display substrate. In the embodiments of the present disclosure, the color separation phenomenon refers to the phenomenon in which the reflected light exhibits its color (e.g., red, green, and blue) separation under the external light (e.g., point light source or line light source) when the display substrate is in the off-screen state.

It should be noted that, in the embodiments of the present disclosure, the racetrack shape refers to a racetrack-like shape formed by a rectangle and two arcs on opposite sides of the rectangle, and the racetrack shape has two straight sides arranged parallel to each other and two circular arcs arranged opposite to each other. The mango shape can be regarded as a deformed shape of an ellipse, which has two arc edges arranged opposite to each other, refer to FIG. 6.

For example, as shown in FIG. 3 and FIG. 6, in the direction perpendicular to the surface of the base substrate 101, the plurality of sub-pixel openings 1081 are in one-to-one correspondence with and overlapped with the plurality of first light-transmitting openings 1131. For one sub-pixel opening 1081 and one first light-transmitting opening 1131 that are provided corresponding to each other, and in the direction parallel to the surface of the base substrate 101, the plane shape of the sub-pixel opening 1081 is the same as the plane shape of the first light-transmitting opening 1131, and both are shown as an ellipse (or a mango shape) in the figures. For example, in some examples, the plane shape of the main body portion 1041 of the first electrode layer 104 of the light-emitting device EM is the same as the plane shape of the sub-pixel opening 1081 and the first light-transmitting opening 1131.

For example, as shown in FIG. 3 and FIG. 6, the orthographic projection of the sub-pixel opening 1081 on the base substrate 101 is located within the orthographic projection of the first light-transmitting opening 1131 on the base substrate 101, that is, the plane size of the sub-pixel opening 1081 is smaller than the plane size of the first light-transmitting opening 1131. For example, the orthographic projection of the first light-transmitting opening 1131 on the base substrate 101 is located within the orthographic projection of the main body portion 1041 on the base substrate

101, that is, the plane size of the first light-transmitting opening 1131 is smaller than the plane size of the main body portion 1041. Therefore, the display substrate provided by the embodiments of the present disclosure can save power consumption and resources while reducing or even eliminating the phenomenon of color separation in the display substrate.

For example, as shown in FIG. 2, in some embodiments, the display substrate further includes a color film layer 114, the color film layer 114 includes a plurality of color film patterns 1141, and the plurality of color film patterns 1141 are respectively provided in the plurality of first light-transmitting openings 1131. Therefore, the light emitted by the light-emitting device EM of the sub-pixel can be emitted out through the color film pattern 1141 to improve the purity of the emitted light.

Figure 14:
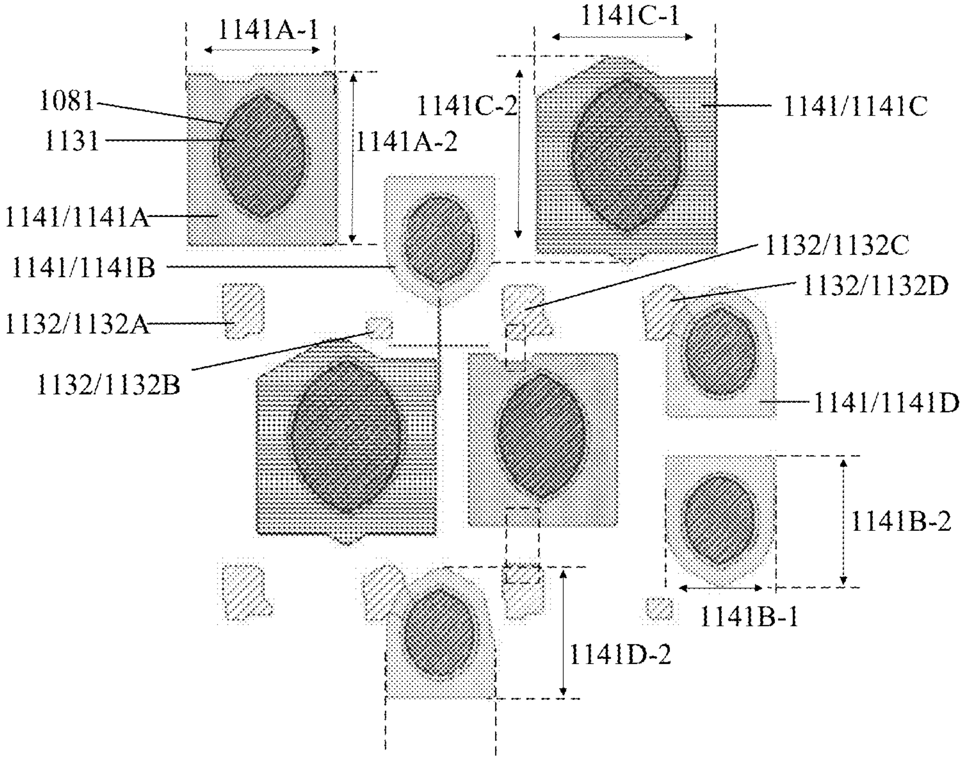
FIG. 14 is a schematic partial plan view of a black matrix layer and a color film layer of a display substrate provided by at least one embodiment of the present disclosure.

For example, FIG. 14 shows a schematic partial plan view of the black matrix layer and the color film layer of the display substrate, and shows a schematic plan view of a plurality of first light-transmitting openings 1131, a plurality of second light-transmitting openings 1132, and a plurality of color film patterns 1141. As shown in FIG. 14, in the direction perpendicular to the surface of the base substrate 101, the plurality of color film patterns 1141 include a first color film pattern 1141A at least partially overlapping with the light-emitting device of the first sub-pixel (e.g., the red sub-pixel) and a second color film pattern 1141B at least partially overlapping with the light-emitting device of the second sub-pixel (e.g., the green sub-pixel). In the direction parallel to the surface of the base substrate 101, the plane shape of the first color film pattern 1141A is different from the plane shape of the second color film pattern 1141B, and the area of the first color film pattern 1141A is larger than the area of the second color film pattern 1141B.

For example, as shown in FIG. 14, the plane shape of the first color film pattern 1141A is substantially rectangular, such as a rectangle with a notch, and the plane shape of the second color film pattern 1141B is substantially semi-elliptical. For example, the area of the first color film pattern 1141A and the area of the second color film pattern 1141B are respectively larger than the areas of the first light-transmitting openings 1131 covered by them, so as to fully realize the effect of light filtering.

For example, in some examples, the ratio of the area of the first color film pattern 1141A to the area of the second color film pattern 1141B is in a range of (1~1.5):1, such as 1.2:1, 1.4:1, or the like.

For example, as shown in FIG. 14, in the direction perpendicular to the surface of the base substrate 101, the plurality of color film patterns 1141 further include a third color film pattern 1141C at least partially overlapping with the light-emitting device of the third sub-pixel P3 (e.g., the blue sub-pixel). In the direction parallel to the surface of the base substrate 101, the plane shape of the third color film pattern 1141C is different from the plane shape of the first color film pattern 1141A and the plane shape of the second color film pattern 1141B, and the area of the third color film pattern 1141C is larger than the area of the first color film pattern 1141A and the area of the second color film pattern 1141B, respectively. For example, the plane shape of the third color film pattern 1141C is an irregular shape, so as to fully realize the effect of light filtering.

For example, in some embodiments, the ratio of the area of the first color film pattern 1141A, the area of the second color film pattern 1141B, and the area of the third color film pattern 1141C is in a range of (1~1.5):1:(1~1.6), such as 1.2:1:1.1, 1.4:1:1.3, or the like.

For example, as shown in FIG. 14, in the direction perpendicular to the surface of the base substrate 101, the plurality of color film patterns 1141 further include a fourth color film pattern 1141D at least partially overlapping with the light-emitting device of the fourth sub-pixel P4 (e.g., the green sub-pixel). In the direction parallel to the surface of the base substrate 101, the plane shape of the fourth color film pattern 1141D is substantially the same as the plane shape of the second color film pattern 1141B, and the area of the fourth color film pattern 1141D is substantially equal to the area of the second color film pattern 1141B.

For example, the plane shape of the fourth color film pattern 1141D is substantially semi-elliptical, and the area of the fourth color film pattern 1141D is substantially equal to the area of the second color film pattern 1141B, for example, the difference between the area of the fourth color film pattern 1141D and the area of the second color film pattern 1141B is not greater than 10% of the area of the second color film pattern 1141B.

In the embodiments of the present disclosure, the black matrix layer 113 can absorb the light incident into the display substrate, reduce the reflectivity of the display substrate to external light, and improve the display effect of the display substrate; and by covering the black matrix layer 113 with the color film layer 114, the color film layer 114 can absorb the light incident into the display substrate again to further reduce the reflectivity of the display substrate to external light and improve the display effect of the display substrate. After testing the plurality of color film patterns 1141 shown in FIG. 14, it is found that in the case where the plurality of color film patterns 1141 have the shape and size distribution shown in FIG. 14, the plurality of color film patterns 1141 can fully realize the effect of light filtering as well as the effect of light reflecting, which makes the display effect of the display substrate better.

For example, in some embodiments, as shown in FIG. 14, in the direction perpendicular to the surface of the base substrate 101, the fourth color film pattern 1141D partially overlaps with a fourth light-transmitting sub-opening 1132D.

For example, in some examples, as shown in FIG. 14, the lateral size 1141A-1 of the first color film pattern 1141A corresponding to the first sub-pixel P1 ranges from 27 μm to 33 μm, such as 28 μm, 29 μm, 30 μm, or the like, and the longitudinal size 1141A-2 of the first color film pattern 1141A corresponding to the first sub-pixel P1 ranges from 30 μm to 35 μm, such as 32 μm, 33 μm, 34 μm, or the like; the lateral size 1141B-1 of the second color film pattern 1141B corresponding to the second sub-pixel P2 ranges from 20 μm to 25 μm, such as 21 μm, 22 μm, 23 μm, or the like, and the longitudinal size 1141B-2 of the second color film pattern 1141B corresponding to the second sub-pixel P2 ranges from 23 μm to 28 μm, such as 25 μm, 26 μm, 27 μm, or the like; the lateral size 1141C-1 of the third color film pattern 1141C corresponding to the third sub-pixel P3 ranges from 32 μm to 38 μm, such as 34 μm, 35 μm, 36 μm, or the like, and the longitudinal size 1141C-2 of the third color film pattern 1141C corresponding to the third sub-pixel P3 ranges from 35 μm to 45 μm, such as 38 μm, 40 μm, 42 μm, or the like; and the lateral size 1141D-1 of the fourth color film pattern 1141D corresponding to the fourth sub-pixel P4 ranges from 20 μm to 25 μm, such as 21 μm, 22 μm, 23 μm, or the like, and the longitudinal size 1141D-2 of the fourth color film pattern 1141D corresponding to the fourth sub-pixel P4 ranges from 23 μm to 28 μm, such as 25 μm, 26 μm, 27 μm, or the like.

For example, the minimum distance between edges of the plurality of color film patterns 1141 and edges of the plurality of second light-transmitting openings 1132 ranges from 1 μm to 5 μm. For example, as shown in FIG. 3, for at least part of the color film patterns 1141 and the second light-transmitting openings 1132 that are adjacent to each other, there is a space between the color film pattern 1141 and the second light-transmitting opening 1132, and the minimum distance between the edges of the color film pattern 1141 and the edges of the second light-transmitting opening 1132 ranges from 1 μm to 5 μm, so as to prevent the color film pattern 1141 from filtering the light passing through the second light-transmitting opening 1132.

For example, referring to FIG. 14 and FIG. 6, for one color film pattern 1141 and one sub-pixel opening 1081 corresponding to the same sub-pixel, the plane shape of the one color film pattern 1141 is different from the plane shape of the one sub-pixel opening 1081. For example, at least part of the edges of the plurality of second light-transmitting openings 1132 are parallel to at least part of the edges of the color film patterns 1141 adjacent to the plurality of second light-transmitting openings 1132. For example, in the part shown by the dotted frame in FIG. 14, a part of the edge of the second light-transmitting opening 1132 is parallel to a part of the edge of the color film pattern 1141 adjacent to the second light-transmitting opening 1132.

For example, as shown in FIG. 2, the display substrate may further include a protective cover plate 115 provided on the black matrix layer 113 and the color film layer 114 to protect the structure of the display substrate. For example, the protective cover plate 115 is a glass cover plate, which can be connected to the display substrate by optically transparent glue (not shown in the figure).

Hereinafter, the structure and circuit arrangement of each functional layer of the display substrate provided by the embodiment of the present disclosure will be described in detail through a specific example. In this example, the sub-pixel uses a 7T1C pixel driving circuit to drive the light-emitting device EM.

Figure 7A:
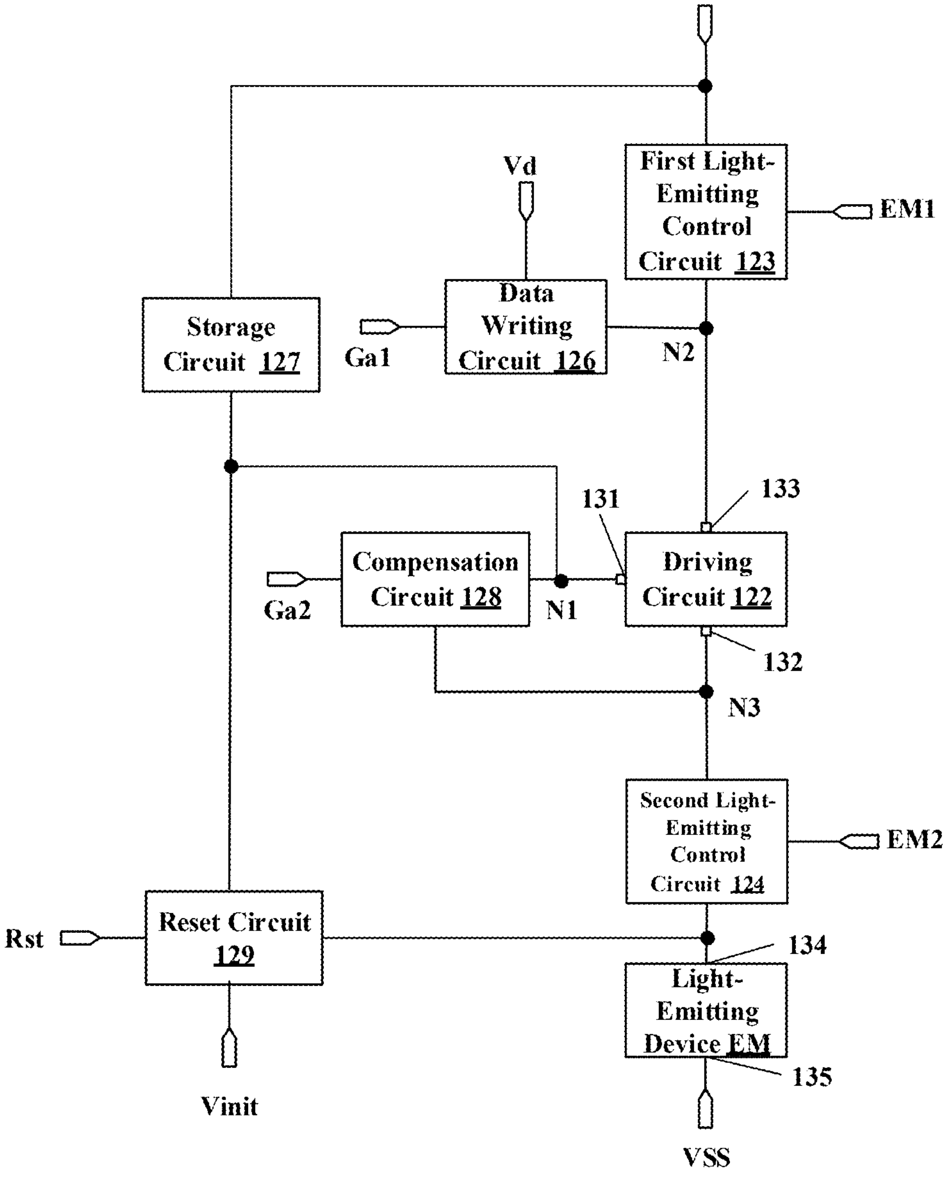
FIG. 7A is a schematic diagram of a pixel driving circuit of a display substrate provided by at least one embodiment of the present disclosure.

For example, FIG. 7A shows a circuit diagram of a 7T1C pixel driving circuit. As shown in FIG. 7A, the pixel driving circuit includes a driving circuit 122, a data writing circuit 126, a compensation circuit 128, a storage circuit 127, a first light-emitting control circuit 123, a second light-emitting control circuit 124, and a reset circuit 129.

For example, the driving circuit 122 includes a control terminal 131, a first terminal 132, and a second terminal 133, and the driving circuit 122 is configured to control a driving current flowing through the light-emitting device EM. The control terminal 131 of the driving circuit 122 is connected to a first node N1, the first terminal 132 of the driving circuit 122 is connected to a second node N2, and the second terminal 133 of the driving circuit 122 is connected to a third node N3.

For example, the data writing circuit 126 includes a control terminal, a first terminal, and a second terminal. The control terminal of the data writing circuit 126 is configured to receive a first scan signal, the first terminal of the data writing circuit 126 is configured to receive a data signal, and the second terminal of the data writing circuit 126 is connected to the first terminal 132 (the second node N2) of the driving circuit 122, and is configured to write the data signal to the first terminal 132 of the driving circuit 122 in response to the first scan signal Ga1. For example, the first terminal of the data writing circuit 126 is connected to a data line 12 to receive the data signal, and the control terminal of the data writing circuit 126 is connected to a scan line 11 to receive the first scan signal Ga1.

For example, during a data writing stage, the data writing circuit 126 is turned on in response to the first scan signal Ga1, so that the data signal is written to the first terminal 132 (the second node N2) of the driving circuit 122, and the data signal is stored in the storage circuit 127, so that the driving current for driving the light-emitting device EM to emit light is generated according to the data signal during, for example, a light-emitting stage.

For example, the compensation circuit 128 includes a control terminal, a first terminal, and a second terminal. The control terminal of the compensation circuit 128 is configured to receive a second scan signal Ga2, the first terminal and the second terminal of the compensation circuit 128 are electrically connected to the control terminal 131 and the second terminal 133 of the driving circuit 122, respectively, and the compensation circuit 128 is configured to perform threshold compensation on the driving circuit 120 in response to the second scan signal.

For example, the storage circuit 127 is electrically connected to the control terminal 131 of the driving circuit 122 and a first voltage terminal VDD, and is configured to store the data signal written by the data writing circuit 126. For example, during a data writing and compensation stage, the compensation circuit 128 is turned on in response to the second scan signal Ga2, so that the data signal written by the data writing circuit 126 is stored in the storage circuit 127. For example, still during the data writing and compensation stage, the compensation circuit 128 electrically connects the control terminal 131 and the second terminal 133 of the driving circuit 122, so that the relevant information of the threshold voltage of the driving circuit 122 is also correspondingly stored in the storage circuit, so that the stored data signal and the threshold voltage can be used to control the driving circuit 122 during, for example, the light-emitting stage, so that the output of the driving circuit 122 is compensated.

For example, the first light-emitting control circuit 123 is connected to the first terminal 132 (the second node N2) of the driving circuit 122 and the first voltage terminal VDD, and is configured to apply a first power supply voltage of the first voltage terminal VDD to the first terminal 132 of the driving circuit 122 in response to a first light-emitting control signal. For example, as shown in FIG. 7A, the first light-emitting control circuit 123 is connected to a first light-emitting control terminal EM1, the first voltage terminal VDD, and the second node N2.

For example, the second light-emitting control circuit 124 is connected to a second light-emitting control terminal EM2, a first terminal 134 of the light-emitting device EM, and the second terminal 132 of the driving circuit 122, and is configured to enable the driving current to be applied to the light-emitting device EM in response to a second light-emitting control signal.

For example, during the light-emitting stage, the second light-emitting control circuit 123 is turned on in response to the second light-emitting control signal provided by the second light-emitting control terminal EM2, so that the driving circuit 122 can apply the driving current to the light-emitting device EM to make it emit light through the second light-emitting control circuit 123; while during the non-light-emitting stage, the second light-emitting control circuit 123 is turned off in response to the second light-emitting control signal, so as to avoid current flowing through the light-emitting device EM to make it emit light, which can improve the contrast of the corresponding display device.

For another example, during an initialization stage, the second light-emitting control circuit 124 is also turned on in response to the second light-emitting control signal, so that the reset circuit is combined to perform a reset operation on the driving circuit 122 and the light-emitting device EM.

For example, the second light-emitting control signal EM2 is the same as or different from the first light-emitting control signal EM1. For example, the second light-emitting control signal EM2 and the first light-emitting control signal EM1 are connected to the same signal output terminal or different signal output terminals, respectively.

For example, the reset circuit 129 is connected to a reset voltage terminal Vinit and the first terminal 134 (a fourth node N4) of the light-emitting device EM, and is configured to apply a reset voltage to the first terminal 134 of the light-emitting device EM in response to a reset signal. In other examples, as shown in FIG. 7A, the reset signal is also applied to the control terminal 131 of the driving circuit, that is, the first node N1. For example, the reset signal is the second scan signal, and the reset signal may also be other signals synchronized with the second scan signal, which is not limited in the embodiments of the present disclosure. For example, as shown in FIG. 7A, the reset circuit 129 is respectively connected to the first terminal 134 of the light-emitting device EM, the reset voltage terminal Vinit, and a reset control terminal Rst (a reset control line). For example, during the initialization stage, the reset circuit 129 is turned on in response to the reset signal, so that the reset voltage is applied to the first terminal 134 of the light-emitting device EM and the first node N1, so that the reset operation is performed on the driving circuit 122, the compensation circuit 128, and the light-emitting device EM to eliminate the influence of the previous light-emitting stage.

For example, the light-emitting device EM includes the first terminal 134 and a second terminal 135, the first terminal 134 of the light-emitting device EM is configured to receive the driving current from the second terminal 133 of the driving circuit 122, and the second terminal 135 of the light-emitting device EM is configured to be connected to a second voltage terminal VSS. For example, in one example, as shown in FIG. 7A, the first terminal 134 of the light-emitting device EM is connected to a third node N3 through the second light-emitting control circuit 124. The embodiments of the present disclosure include, but are not limited to, this case. For example, the light-emitting device EM includes various types of OLEDs, such as top emission, bottom emission, double-sided emission, etc., which can emit red, green, blue, or white light, etc., and the first electrode layer and the second electrode layer of the OLED respectively serve as the first terminal 134 and the second terminal 135 of the light-emitting device. The embodiments of the present disclosure do not limit the specific structure of the light-emitting device.

It should be noted that, in the description of the embodiments of the present disclosure, the first node N1, the second node N2, the third node N3, and the fourth node N4 do not necessarily represent actual components, but represent the junctions of related circuit connections in the circuit diagram.

It should be noted that, in the description of the embodiments of the present disclosure, the symbol Vd can represent both the data signal terminal and the level of the data signal. Similarly, the symbols Ga1 and Ga2 can represent both the first scan signal and the second scan signal, as well as the first scan signal terminal and the second scan signal terminal; the symbol Rst can represent both the reset control terminal and the reset signal; the symbol Vinit can represent both the reset voltage terminal and the reset voltage; the symbol VDD can represent both the first voltage terminal and the first power supply voltage; and the symbol VSS can represent both the second voltage terminal and the second power supply voltage. The following embodiments are the same as the above-mentioned case and will not be repeated here.

Figure 7B:
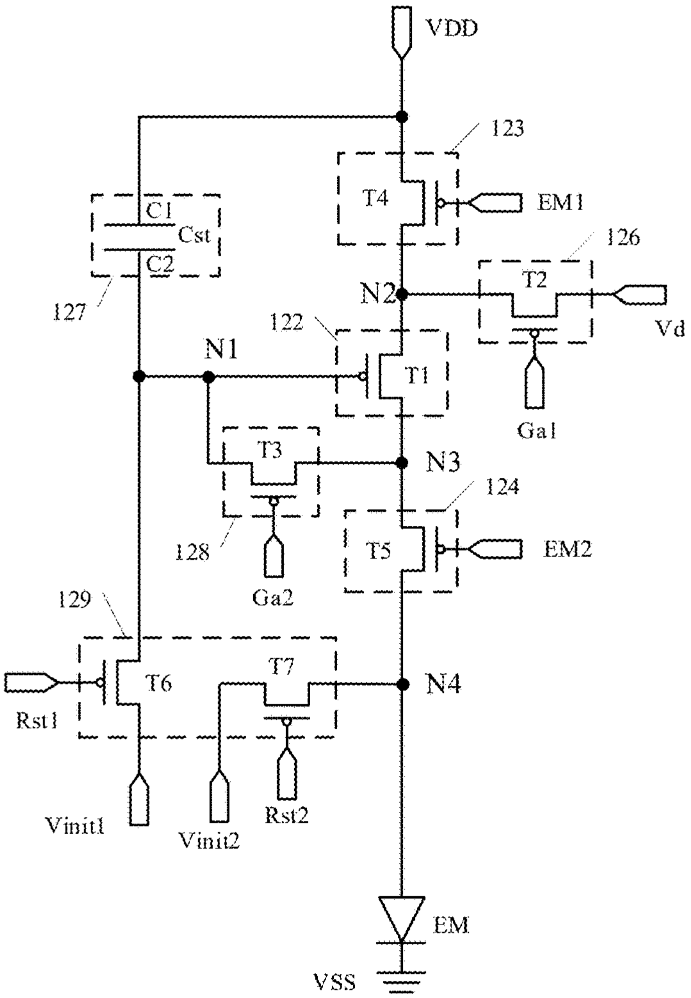
FIG. 7B is a schematic diagram of another pixel driving circuit of a display substrate provided by at least one embodiment of the present disclosure.

FIG. 7B is a circuit diagram of a specific implementation example of the pixel driving circuit shown in FIG. 7A. As shown in FIG. 7B, the pixel driving circuit includes first to seventh transistors T1, T2, T3, T4, T5, T6, and T7, and includes a storage capacitor Cst. For example, the first transistor T1 is used as a driving transistor, and the other second to seventh transistors are used as switching transistors.

For example, as shown in FIG. 7B, the driving circuit 122 is implemented as the first transistor T1. A gate electrode of the first transistor T1 serves as the control terminal 131 of the driving circuit 122 and is connected to the first node N1; a first electrode of the first transistor T1 serves as the first terminal 132 of the driving circuit 122 and is connected to the second node N2; and a second electrode of the first transistor T1 serves as the second terminal 133 of the driving circuit 122 and is connected to the third node N3.

For example, as shown in FIG. 7B, the data writing circuit 126 is implemented as the second transistor T2. A gate electrode of the second transistor T2 is connected to a first scan line (the first scan signal terminal Ga1) to receive the first scan signal, a first electrode of the second transistor T2 is connected to a data line (the data signal terminal Vd) to receive the data signal, and a second electrode of the second transistor T2 is connected to the first terminal 132 (the second node N2) of the driving circuit 122. For example, the second transistor T2 is a P-type transistor, for example, a thin film transistor in which the active layer is formed by low temperature doped polysilicon.

For example, as shown in FIG. 7B, the compensation circuit 128 is implemented as the third transistor T3. A gate electrode of the third transistor T3 is configured to be connected to a second scan line (the second scan signal terminal Ga2) to receive the second scan signal, a first electrode of the third transistor T3 is connected to the control terminal 131 (the first node N1) of the driving circuit 122, and a second electrode of the third transistor T3 is connected to the second terminal 133 (the third node N3) of the driving circuit 122.

For example, as shown in FIG. 7B, the storage circuit 127 is implemented as the storage capacitor Cst, the storage capacitor Cst includes a first capacitor electrode C1 and a second capacitor electrode C2, the first capacitor electrode C1 is connected to the first voltage terminal VDD, and the second capacitor electrode C2 is connected to the control terminal 131 of the driving circuit 122.

For example, as shown in FIG. 7B, the first light-emitting control circuit 123 is implemented as the fourth transistor T4. A gate electrode of the fourth transistor T4 is connected to a first light-emitting control line (the first light-emitting control terminal EM1) to receive the first light-emitting control signal, a first electrode of the fourth transistor T4 is connected to the first voltage terminal VDD to receive the first power supply voltage, and a second electrode of the fourth transistor T4 is connected to the first terminal 132 (the second node N2) of the driving circuit 122.

For example, the light-emitting device EM is implemented as an organic light-emitting diode (OLED), the first electrode layer (here, the anode) of the light-emitting device EM is connected to the fourth node N4 and is configured to receive the driving current from the second terminal 133 of the driving circuit 122 through the second light-emitting control circuit 124, and the second electrode layer (here, the cathode) of the light-emitting device EM is configured to be connected to the second voltage terminal VSS to receive the second power supply voltage. For example, the second voltage terminal is grounded, that is, VSS is at 0V.

For example, the second light-emitting control circuit 124 is implemented as the fifth transistor T5. A gate electrode of the fifth transistor T5 is connected to a second light-emitting control line (the second light-emitting control terminal EM2) to receive the second light-emitting control signal, a first electrode of the fifth transistor T5 is connected to the second terminal 133 (the third node 133) of the driving circuit 122, and a second electrode of the fifth transistor T5 is connected to the first terminal 134 (the fourth node N4) of the light-emitting device EM.

For example, the reset circuit 129 includes a first reset circuit and a second reset circuit, the first reset circuit is configured to apply a first reset voltage Vini1 to the first node N1 in response to a first reset signal Rst1, and the second reset circuit is configured to apply a second reset voltage Vini2 to the fourth node N4 in response to a second reset signal Rst2. For example, as shown in FIG. 7B, the first reset circuit is implemented as the sixth transistor T6, and the second reset circuit is implemented as the seventh transistor T7. A gate electrode of the sixth transistor T6 is configured to be connected to a first reset control terminal Rst1 to receive the first reset signal Rst1, a first electrode of the sixth transistor T6 is connected to a first reset voltage terminal Vinit1 to receive the first reset voltage Vinit1, and a second electrode of the six transistor T6 is configured to be connected to the first node N1. A gate electrode of the seventh transistor T7 is configured to be connected to a second reset control terminal Rst2 to receive the second reset signal Rst2, a first electrode of the seventh transistor T7 is connected to a second reset voltage terminal Vinit2 to receive the second reset voltage Vinit2, and a second electrode of the seven transistor T7 is configured to be connected to the fourth node N4.

It should be noted that each of the transistors used in the embodiments of the present disclosure may be a thin film transistor, a field effect transistor or other switching component having the same characteristics. In the embodiments of the present disclosure, the thin film transistor is taken as an example for description. The source electrode and drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode.

For example, referring to FIG. 1, the first signal line S1 is a light-emitting control line EMT, which is used to transmit the above-mentioned first light-emitting control signal EM1 and the second light-emitting control signal EM2. The second signal line S2 is a reset voltage line VNT, which is used to transmit the above-mentioned first reset voltage Vinit1 and the second reset voltage Vini2. For example, a side of the reset voltage line VNT away from the light-emitting control line EMT further has a reset control line RST for transmitting the above-mentioned first reset signal Rst1 and second reset signal Rst2.

The layout design of the above-mentioned pixel driving circuit will be described in detail below.

Figure 8:
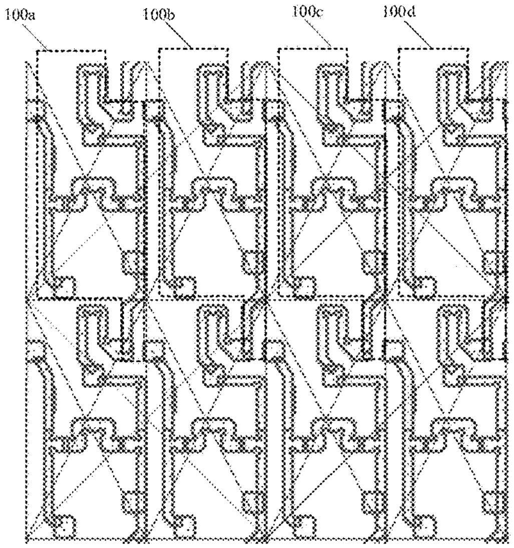
FIG. 8-FIG. 13B are schematic partial plan views of respective functional layers of a display substrate and schematic partial plan views of the respective functional layers stacked in sequence provided by at least one embodiment of the present disclosure.

For example, FIG. 8 shows a schematic diagram of a semiconductor layer of the display substrate, the semiconductor layer is used to form the active layers of the thin film transistors T1 to T7 of the pixel driving circuits of a plurality of sub-pixels. FIG. 8 shows pixel driving circuits of two rows of sub-pixels, and the following takes the pixel driving circuits of four directly adjacent sub-pixels (i.e., a first sub-pixel 100*a*, a second sub-pixel 100*b*, a third sub-pixel 100*c*, and a fourth sub-pixel 100*d*) as an example. The dotted frame in the figure shows the region where the pixel driving circuit of each sub-pixel is located, and the embodiments of the present disclosure are not limited to this layout.

For example, a first gate insulating layer is further provided on the semiconductor layer, which is not shown in the figure, and reference may be made to the first gate insulating layer 1024 in FIG. 5.

Figure 9A:
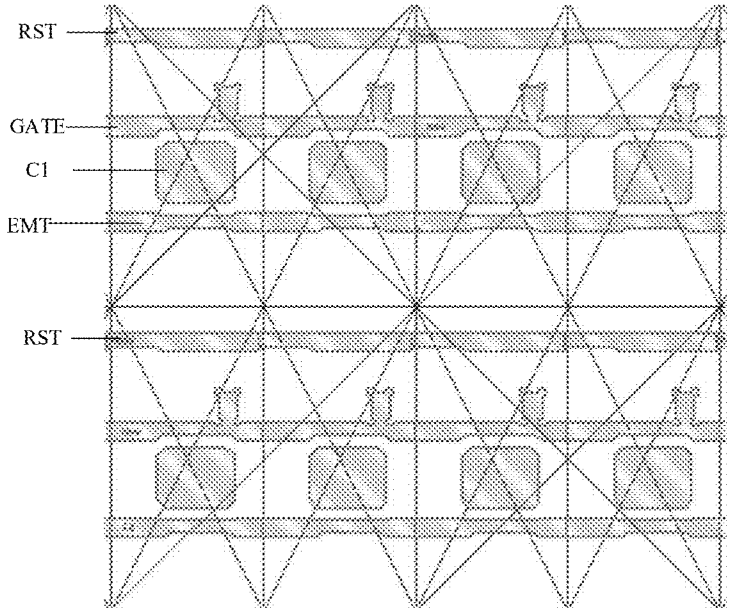
Figure 9B:
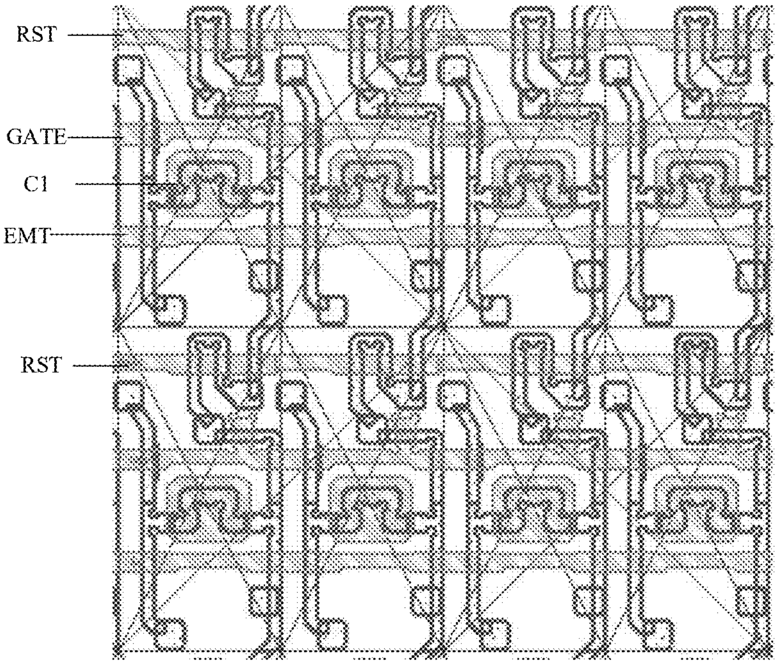

For example, FIG. 9A shows a schematic diagram of a first gate metal layer of the display substrate, the first gate metal layer is provided on the first gate insulating layer, and FIG. 9B shows a schematic diagram of a stacked layer, in which the first gate metal layer and the semiconductor layer are stacked, of the display substrate.

For example, as shown in FIG. 9A and FIG. 9B, the first gate metal layer includes a plurality of light-emitting control lines EMT, a plurality of reset control lines RST, a plurality of scan lines GATE, and the first capacitor electrodes C1 of a plurality of storage capacitors Cst, for example, the portions of the light-emitting control line EMT, the reset control line RST, the scan line GATE, and the first capacitor electrode C1 of the storage capacitor Cst overlapping with the active layers of the thin film transistors T1 to T7 constitute the gate electrodes of the thin film transistors T1 to T7. The plurality of light-emitting control lines EMT, the plurality of reset control lines RST, and the plurality of scan lines GATE are respectively electrically connected to a plurality of rows of sub-pixels in one-to-one correspondence to provide corresponding electrical signals.

For example, a second gate insulating layer is further provided on the first gate metal layer, which is not shown in the figure, and reference may be made to the second gate insulating layer 1025 in FIG. 5.

Figure 10A:
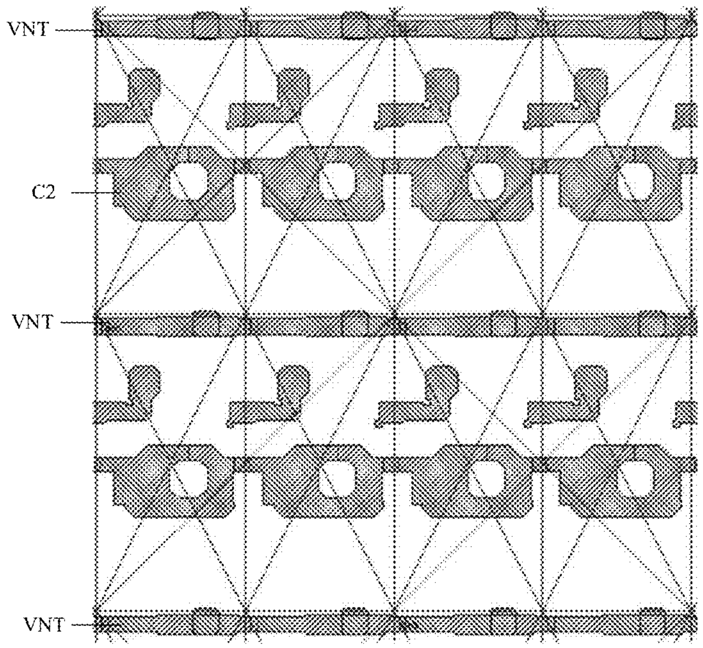
Figure 10B:
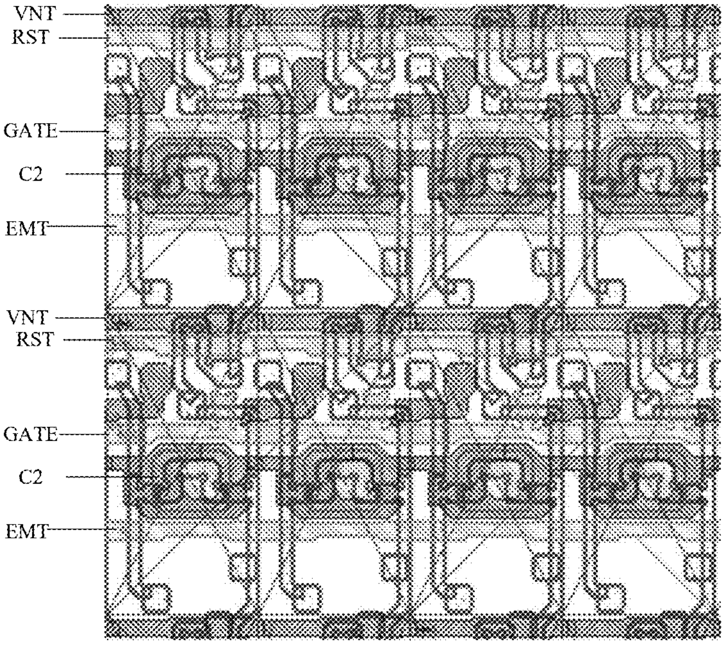

FIG. 10A shows a schematic diagram of a second gate metal layer of the display substrate, the second gate metal layer is provided on the second gate insulating layer, and FIG. 10B shows a schematic diagram of a stacked layer, in which the second gate metal layer, the first gate metal layer, and the semiconductor layer are stacked, of the display substrate.

For example, as shown in FIG. 10A and FIG. 10B, the second gate metal layer includes the second capacitor electrodes C2 of the storage capacitors Cst and a plurality of reset voltage lines VNT. The second capacitor electrode C2 of the storage capacitor Cst at least partially overlaps with the first capacitor electrode C1 to form a capacitor. The plurality of reset voltage lines VNT are electrically connected to the plurality of rows of sub-pixels in one-to-one correspondence to provide corresponding electrical signals.

For example, an interlayer insulating layer is further provided on the second gate metal layer, which is not shown in the figures, and reference may be made to the interlayer insulating layer 1026 in FIG. 5.

Figure 11A:
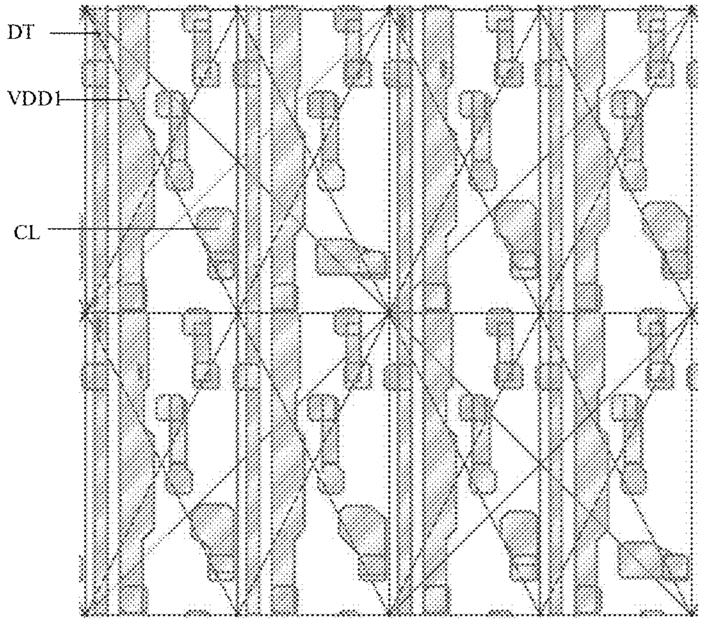
Figure 11B:
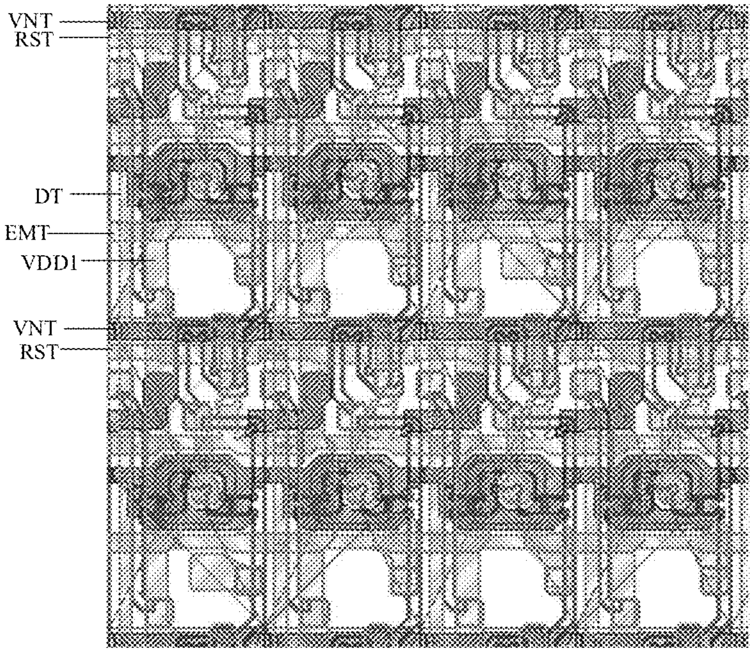

FIG. 11A shows a schematic diagram of a first source-drain metal layer of the display substrate, the first source-drain metal layer is provided on the interlayer insulating layer, and FIG. 11B shows a schematic diagram of a stacked layer, in which the first source-drain metal layer, the second gate metal layer, the first gate metal layer, and the semiconductor layer are stacked, of the display substrate.

As shown in FIG. 11A and FIG. 11B, the first source-drain metal layer includes a plurality of first power supply lines VDD1. For example, the plurality of first power supply lines VDD1 are respectively electrically connected to the plurality of columns of sub-pixels in one-to-one correspondence to provide the first power supply voltage. For example, the first source-drain metal layer further includes a plurality of data lines DT. The plurality of data lines DT are electrically connected to the plurality of columns of sub-pixels in one-to-one correspondence to provide data signals. For example, the first source-drain metal layer further includes a plurality of connection electrodes CL for connecting the second capacitor electrode C2 to the first electrode of the third transistor T3, or connecting the first electrode of the sixth transistor T6 to the reset voltage line VNT, or connecting the second electrode of the fifth transistor T5 to the first electrode layer of the light-emitting device, etc.

For example, a passivation layer and a planarization layer are further provided on the first source-drain metal layer, which are not shown in the figures, and reference may be made to the passivation layer 1027 and the planarization layer 1091 in FIG. 5.

Figure 12B:
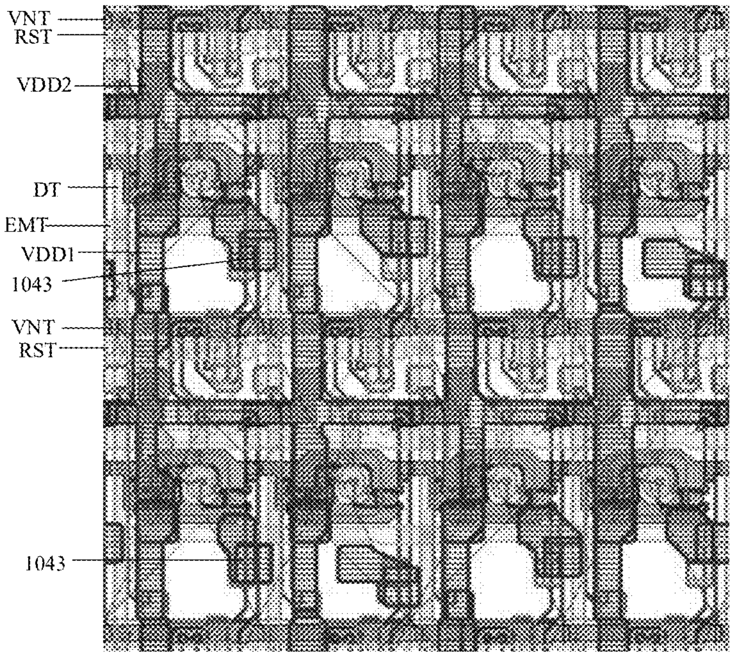

FIG. 12A shows a schematic diagram of a second source-drain metal layer of the display substrate, and the second source-drain metal layer is provided on the planarization layer 1091. FIG. 12B shows a schematic diagram of a stacked layer, in which the second source-drain metal layer, the first source-drain metal layer, the second gate metal layer, the first gate metal layer, and the semiconductor layer are stacked, of the display substrate.

As shown in FIG. 12A and FIG. 12B, the second source-drain metal layer includes a second power supply line VDD2, and the second power supply line VDD2 is in a grid shape. For example, the second power supply line VDD2 is electrically connected to the first power supply line VDD1 to help reduce the resistance of the power supply line, thereby reducing the voltage drop of the power supply line, and to help uniformly transmit the first power supply voltage to each sub-pixel of the display substrate. For example, the second source-drain metal layer further includes a connection electrode 1043 for connecting the first electrode layer of the light-emitting device to the first electrode of the first transistor T1.

For example, another planarization layer is further provided on the second source-drain metal layer, which is not shown in the figure, and reference may be made to the planarization layer 109 in FIG. 5, and the planarization layer 109 has a plurality of vias VA.

Figure 13A:
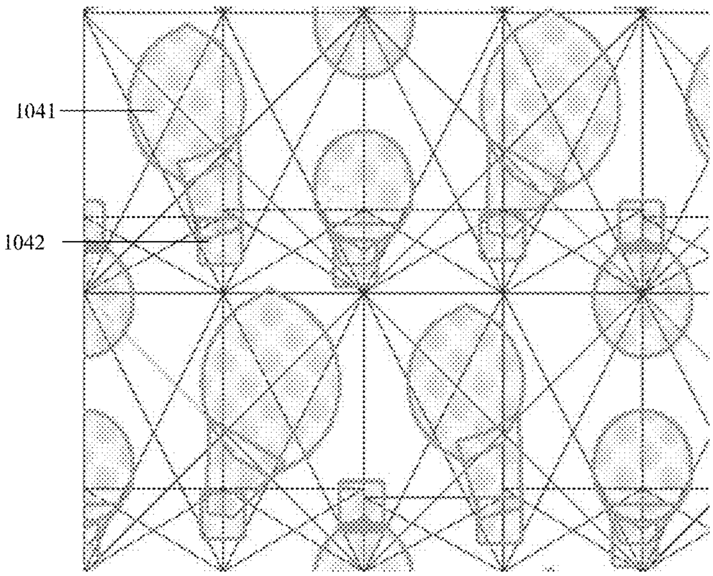
Figure 13B:
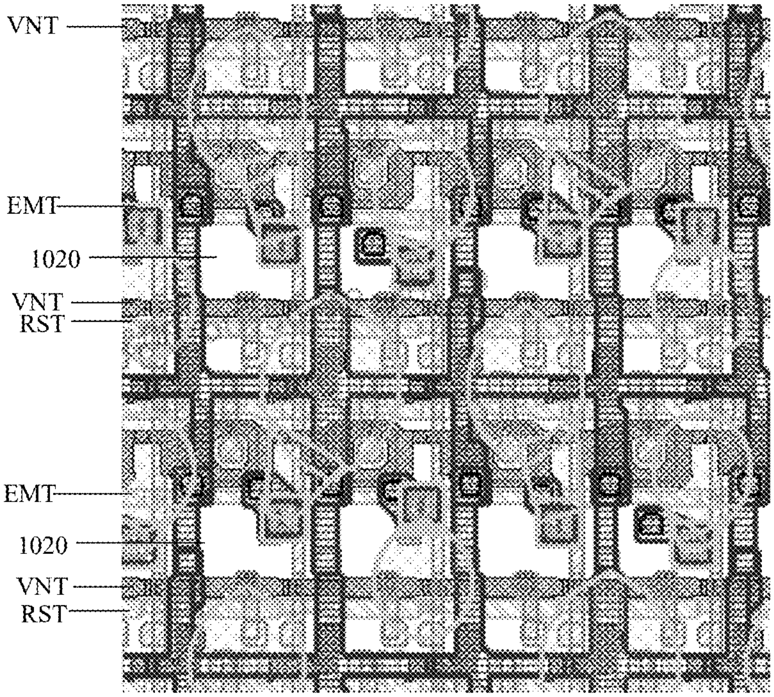

FIG. 13A shows a schematic diagram of a first electrode material layer of the display substrate, and the first electrode material layer is provided on the passivation layer 109. FIG. 13B shows a schematic diagram of a stacked layer, in which the first electrode material layer, the second source-drain metal layer, the first source-drain metal layer, the second gate metal layer, the first gate metal layer, and the semiconductor layer are stacked, of the display substrate.

As shown in FIG. 13A and FIG. 13B, the first electrode material layer includes the first electrode layers of the light-emitting devices EM of a plurality of sub-pixels, and the first electrode layers of the light-emitting devices EM of the plurality of sub-pixels are connected to the connection electrodes 1043 through the plurality of vias VA in the planarization layers 109, respectively. For example, a light-emitting material layer of the light-emitting device EM is provided on the first electrode layer, and a second electrode layer is provided on the light-emitting material layer.

For example, other functional layers such as an encapsulation layer, a black matrix layer, and the like are further formed above the light-emitting device EM, which will not be repeated here.

Figure 15:
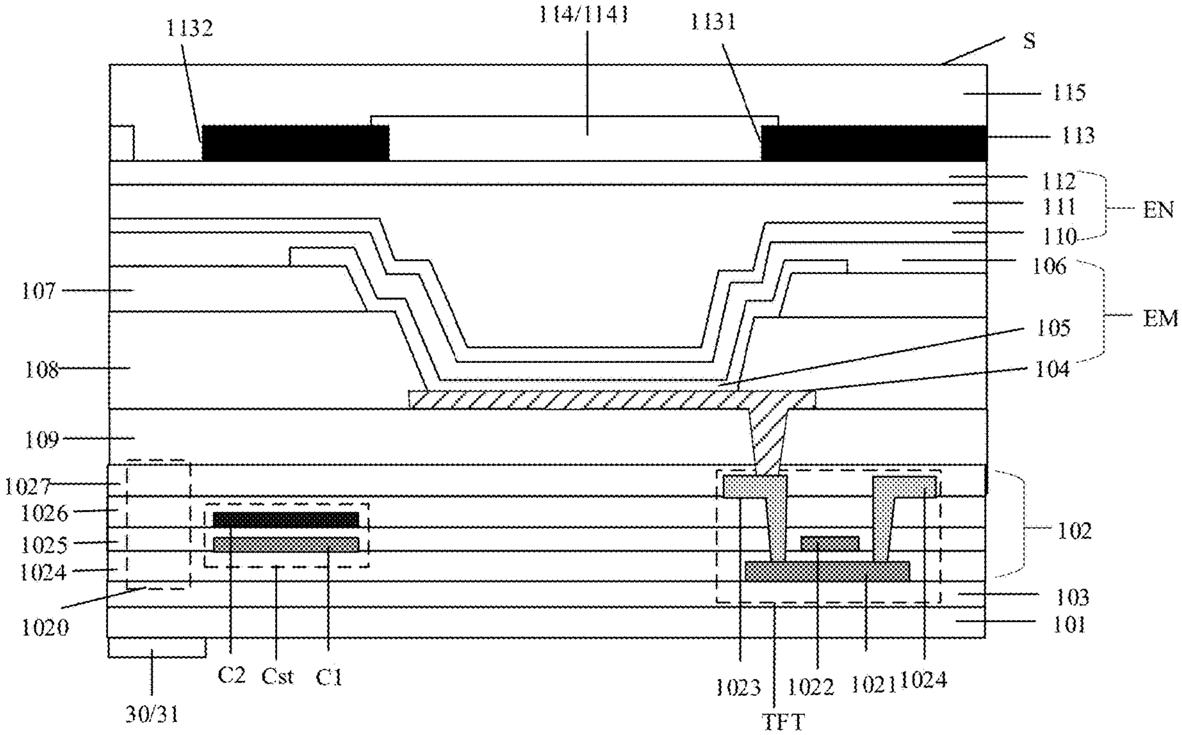
FIG. 15 is a schematic cross-sectional view of a display device provided by at least one embodiment of the present disclosure.

At least one embodiment of the present disclosure further provides a display device, and FIG. 15 shows a schematic cross-sectional view of the display device. As shown in FIG. 15, the display device includes the display substrate provided by the embodiments of the present disclosure, and the figure shows the display substrate in FIG. 2 as an example.

For example, in some embodiments, the display device further includes a texture touch surface S and an image sensor array 30, for example, the surface of the protective cover plate 115 is implemented as the texture touch surface S. The image sensor array is provided on the side of the driving circuit layer 102 away from the light-emitting device layer, and includes a plurality of image sensors 31 (one image sensor is shown as an example in the figure), and the plurality of image sensors 31 are configured to receive light, which is emitted from the plurality of light-emitting devices EM in the light-emitting device layer, reflected by a texture (e.g., a fingerprint, a palm print, etc.) on the texture touch surface S, and reaching the plurality of image sensors 31 through the plurality of second light-transmitting openings 1132, for texture collection.

For example, referring to FIG. 15, the driving circuit layer includes a plurality of light-transmitting portions 1020, and one second light-transmitting opening 1132 corresponds to one light-transmitting portion 1020. In this case, the plurality of image sensors 31 are configured to receive light, which is emitted from the plurality of light-emitting devices EM in the light-emitting device layer, reflected by the texture on the texture touch surface S, and reaching the plurality of image sensors 31 through the plurality of second light-transmitting openings 1132 of the black matrix layer 113 and the plurality of light-transmitting portions 1020 of the driving circuit layer, for texture collection. Thus, the plurality of image sensors 31 can sufficiently receive the light reflected by the texture through the plurality of second light-transmitting openings 1132 and the plurality of light-transmitting portions 1020, thereby increasing the speed of texture recognition and the accuracy of texture recognition.

The display device provided by the embodiments of the present disclosure may further have other structures, and reference may be made to the related art for details, which will not be repeated here.

The following statements should be noted:

(1) The drawings of the present disclosure involve only the structure(s) in connection with the embodiment(s) of the present disclosure, and other structure(s) can be referred to common design(s).

(2) For clarity, in the drawings used to describe the embodiments of the present disclosure, the thicknesses of layers or regions are enlarged or reduced, that is, the drawings are not drawn to actual scale. It can be understood that when a component such as a layer, film, region or substrate is referred to as being "on" or "under" another component, the component may be "directly" "on" or "under" another component, or one or more intermediate components may be interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A display substrate, having a plurality of sub-pixels arranged in a plurality of rows and columns, and comprising a base substrate, a driving circuit layer on the base substrate, a light-emitting device layer on a side of the driving circuit layer away from the base substrate, and a black matrix layer on a side of the light-emitting device layer away from the base substrate, wherein each of the plurality of sub-pixels comprises a pixel driving circuit in the driving circuit layer and a light-emitting device in the light-emitting device layer, and the pixel driving circuit is configured to drive the light-emitting device;

the driving circuit layer comprises a first signal line and a second signal line arranged parallel to each other and arranged periodically, and the first signal line and the second signal line are configured to provide different electrical signals to the plurality of sub-pixels;

the black matrix layer comprises a plurality of first light-transmitting openings and a plurality of second light-transmitting openings, the plurality of first light-transmitting openings respectively expose light-emitting devices of the plurality of sub-pixels, and the plurality of second light-transmitting openings are respectively arranged between the plurality of first light-transmitting openings; and orthographic projections of the plurality of second light-transmitting openings on the base substrate are respectively between an orthographic projection of one first signal line on the base substrate and an orthographic projection of one second signal line closest to the one first signal line on the base substrate;

the driving circuit layer comprises a third signal line and a fourth signal line arranged parallel to each other and arranged periodically, the third signal line and the fourth signal line respectively intersects the first signal line and the second signal line, and the third signal line and the fourth signal line are configured to provide different electrical signals to the plurality of sub-pixels; and the orthographic projections of the plurality of second light-transmitting openings on the base substrate are respectively between an orthographic projection of one third signal line on the base substrate and an orthographic projection of one fourth signal line adjacent to the one third signal line on the base substrate.

2. The display substrate according to claim 1, wherein the first signal line is a light-emitting control signal line, and the second signal line is a reset voltage line.

3. The display substrate according to claim 2, wherein the plurality of sub-pixels arranged in a plurality of rows and columns comprise at least one row of first sub-pixels, and at least one row of second sub-pixel adjacent to the one row of first sub-pixels and located at a lower level of the one row of first sub-pixels;

pixel driving circuits of the at least one row of first sub-pixels share one light-emitting control signal line and one reset voltage line, and pixel driving circuits of the at least one row of second sub-pixels share one light-emitting control signal line and one reset voltage line; and orthographic projections of one row of second light-transmitting openings on the base substrate are between an orthographic projection of the one light-emitting control signal line shared by the pixel driving circuits of the at least one row of first sub-pixels on the base substrate and an orthographic projection of the one reset voltage line shared by the pixel driving circuits of the at least one row of second sub-pixels on the base substrate.

4. The display substrate according to claim 1, wherein the third signal line is a first power supply line, and the fourth signal line is a data line.

5. The display substrate according to claim 1, wherein the first signal line, the second signal line, the third signal line, and the fourth signal line define a plurality of first regions, and the orthographic projections of the plurality of second light-transmitting openings on the base substrate are respectively within orthographic projections of the plurality of first regions on the base substrate.

6. The display substrate according to claim 2, wherein the pixel driving circuit comprises a thin film transistor and a storage capacitor, the thin film transistor comprises a gate electrode on the base substrate, the storage capacitor comprises a first capacitor electrode and a second capacitor electrode on the base substrate, and the second capacitor electrode is on a side of the first capacitor electrode away from the base substrate; and the light-emitting control signal line is in a same layer as the gate electrode and the first capacitor electrode.

7. The display substrate according to claim 6, wherein the reset voltage line is in a same layer as the second capacitor electrode.

8. The display substrate according to claim 5, further comprising a planarization layer on a side of the driving circuit layer away from the base substrate and a pixel definition layer on a side of the planarization layer away from the base substrate, wherein the pixel definition layer comprises a plurality of sub-pixel openings;

the light-emitting device comprises a first electrode layer, a light-emitting material layer, and a second electrode layer that are sequentially stacked in a direction away from the base substrate, the first electrode layer is on the side of the planarization layer away from the base substrate, the pixel definition layer is on a side of the first electrode layer away from the base substrate, and the plurality of sub-pixel openings respectively expose first electrode layers of the light-emitting devices of the plurality of sub-pixels;

the planarization layer comprises a plurality of vias, and the first electrode layers of the light-emitting devices of the plurality of sub-pixels are electrically connected to pixel driving circuits of the plurality of sub-pixels through the plurality of vias, respectively; and a plurality of vias corresponding to a plurality of sub-pixels in a same row comprise a first via, a second via, and a third via, and a first straight line passes through the first via and the second via, but does not pass through the third via.

9. The display substrate according to claim 8, wherein orthographic projections of at least part of the plurality of vias on the base substrate are respectively within orthographic projections of the plurality of first regions on the base substrate.

10. The display substrate according to claim 8, further comprising a plurality of connection electrodes on a side of the planarization layer close to the base substrate, wherein the first electrode layers of the light-emitting devices of the plurality of sub-pixels are electrically connected to the plurality of connection electrodes through the plurality of vias, respectively, and the plurality of connection electrodes are electrically connected to the pixel driving circuits of the plurality of sub-pixels; and orthographic projections of at least part of the plurality of connection electrodes on the base substrate are within orthographic projections of the plurality of first regions on the base substrate.

11. The display substrate according to claim 8, wherein the plurality of sub-pixels comprise a red sub-pixel, a green sub-pixel, and a blue sub-pixel, and taking one blue sub-pixel, one red sub-pixel, and two green sub-pixels as a repeating unit, the plurality of sub-pixels constitute a plurality of repeating units arranged in a plurality of rows and columns; and four vias corresponding to one blue sub-pixel, one red sub-pixel, and two green sub-pixels in a same row and adjacent to each other are not in a same straight line.

12. The display substrate according to claim 8, wherein three vias corresponding to three green sub-pixels in a same row and adjacent to each other are not in a same straight line.

13. The display substrate according to claim 8, wherein a second straight line sequentially passes through a plurality of vias corresponding to a plurality of sub-pixels in a same column.

14. The display substrate according to claim 1, wherein the driving circuit layer comprises a plurality of light-transmitting portions, and the plurality of light-transmitting portions are capable of transmitting light in a direction perpendicular to a surface of the base substrate; and at least part of the plurality of second light-transmitting openings are in one-to-one correspondence with at least part of the plurality of light-transmitting portions, and are configured to transmit light.

15. The display substrate according to claim 14, wherein the first signal line, the second signal line, the third signal line, the fourth signal line, and the plurality of connection electrodes together define the plurality of light-transmitting portions.

16. The display substrate according to claim 14, wherein for a second light-transmitting opening and a light-transmitting portion that are provided corresponding to each other, and in a direction parallel to the surface of the base substrate, a plane shape of the second light-transmitting opening is at least partially same as a plane shape of the light-transmitting portion, and a plane size of the second light-transmitting opening is smaller than a plane size of the light-transmitting portion.

17. The display substrate according to claim 14, wherein for a second light-transmitting opening and a light-transmitting portion that are provided corresponding to each other, and in a direction parallel to the surface of the base substrate, a plane shape of the second light-transmitting opening is circular, a plane shape of the light-transmitting portion is polygonal, and a plane size of the second light-transmitting opening is smaller than a plane size of the light-transmitting portion.

18. A display device, comprising the display substrate according to claim 1.

* * * * *